(12) United States Patent
Matsuura et al.

(10) Patent No.: US 7,742,541 B2
(45) Date of Patent: Jun. 22, 2010

(54) TRANSMISSION CIRCUIT, AND COMMUNICATION APPARATUS USING THE SAME

(75) Inventors: Toru Matsuura, Osaka (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 734 days.

(21) Appl. No.: 11/785,185

(22) Filed: Apr. 16, 2007

(65) Prior Publication Data

US 2007/0254622 A1 Nov. 1, 2007

(30) Foreign Application Priority Data

Apr. 28, 2006 (JP) .............................. 2006-126798

(51) Int. Cl.
*H04L 25/03* (2006.01)
*H04L 25/49* (2006.01)
*H04L 27/04* (2006.01)
*H03C 3/00* (2006.01)

(52) U.S. Cl. ........................ 375/297; 375/300; 375/302

(58) Field of Classification Search ................. 375/295, 375/296, 297, 298, 300, 302; 455/108, 110, 455/114.2, 114.3; 332/159, 161
See application file for complete search history.

(56) References Cited

U.S. PATENT DOCUMENTS 5,901,346 A * 5/1999 Stengel et al. ............... 455/126

| 6,078,628 | A  | * | 6/2000 | Griffith et al. | ............... | 375/300 |
| 6,737,914 | B2 | * | 5/2004 | Gu | ................................. | 330/2 |
| 7,260,368 | B1 | * | 8/2007 | Blumer | ....................... | 455/108 |
| 2004/0101065 | A1 | * | 5/2004 | Hagh et al. | .................. | 375/297 |
| 2004/0185805 | A1 | | 9/2004 | Kim et al. | | |

FOREIGN PATENT DOCUMENTS

JP 05-037263 2/1993

* cited by examiner

*Primary Examiner*—Betsy L Deppe
(74) *Attorney, Agent, or Firm*—Wenderoth, Lind & Ponack, L.L.P.

(57) ABSTRACT

A compact transmission circuit for outputting a highly linear transmission signal regardless of the output power level and operating at a high efficiency is provided. A signal generation section 11 generates an amplitude signal and quadrature data based on input data. A calculation section 21 calculates using the amplitude signal and the quadrature data to output a discrete value having a level discrete at every predetermine time period, and first and second phase signals. An amplitude amplification section 17 outputs a voltage controlled in accordance with the discrete value. Angular modulation sections 13 and 14 angular-modulate the phase signals and output first and second angle-modulated signals. Amplitude modulation sections 15 and 16 amplitude-modulate the angle-modulated signals with the voltage from the amplitude amplification section 17 and output first and second modulated signals. A combining section 18 combines the first and second modulated signals and outputs a transmission signal.

22 Claims, 25 Drawing Sheets

F I G. 1 0
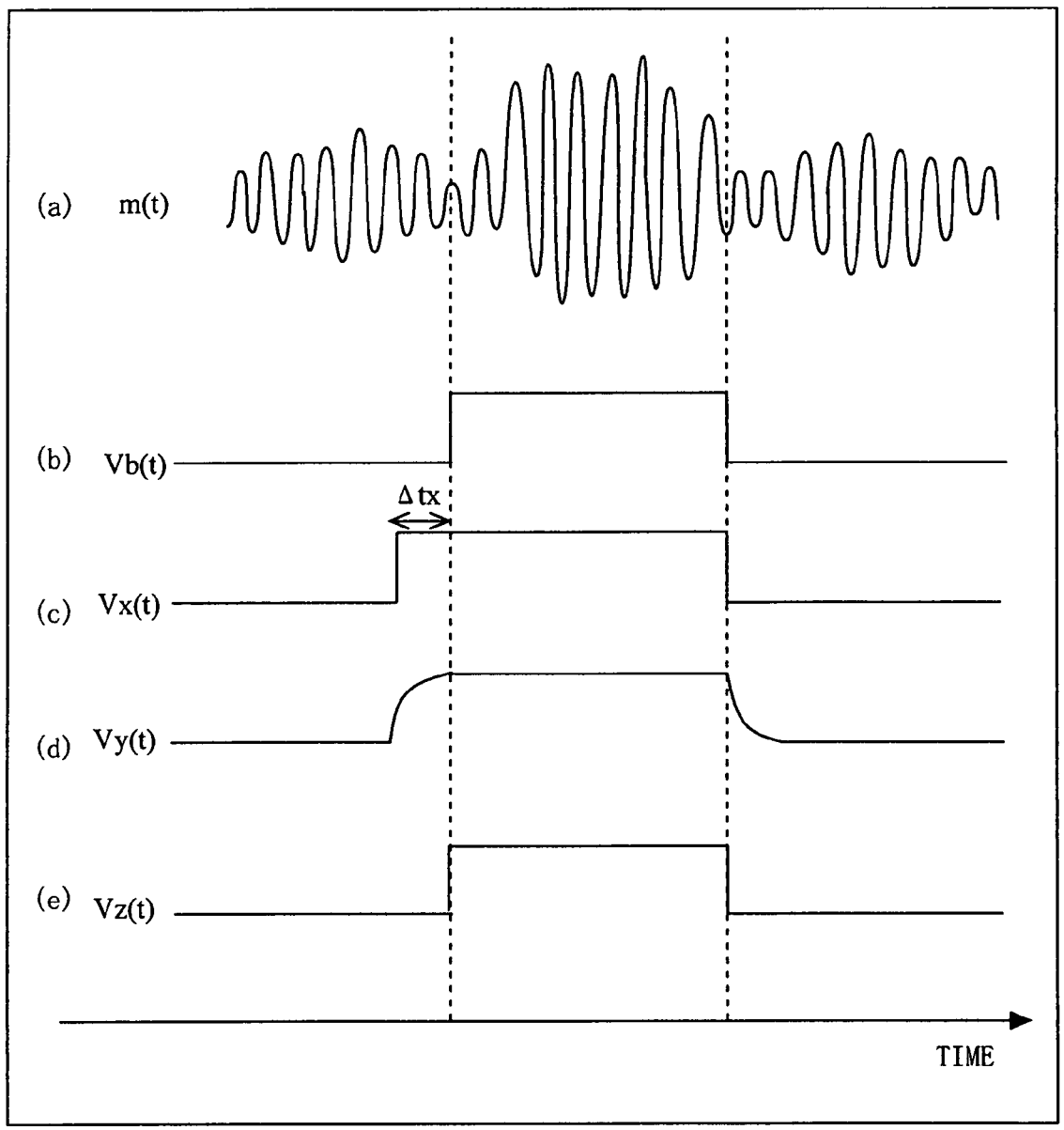

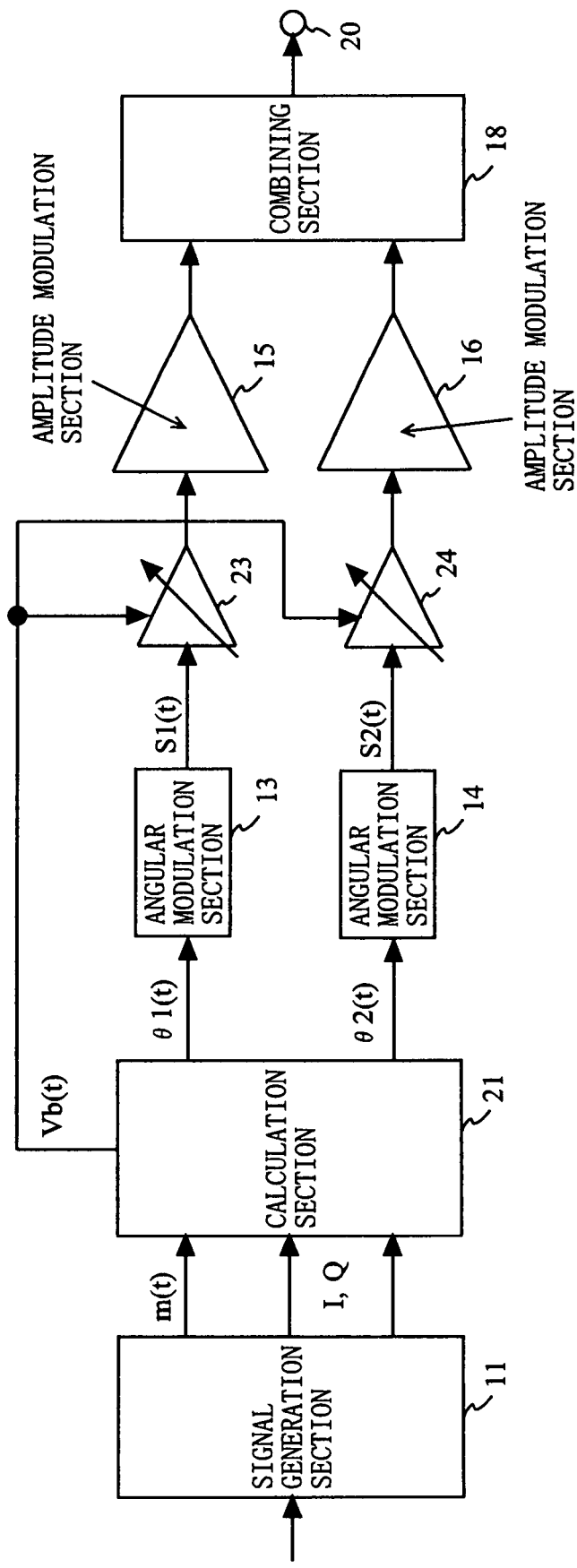
F I G. 11

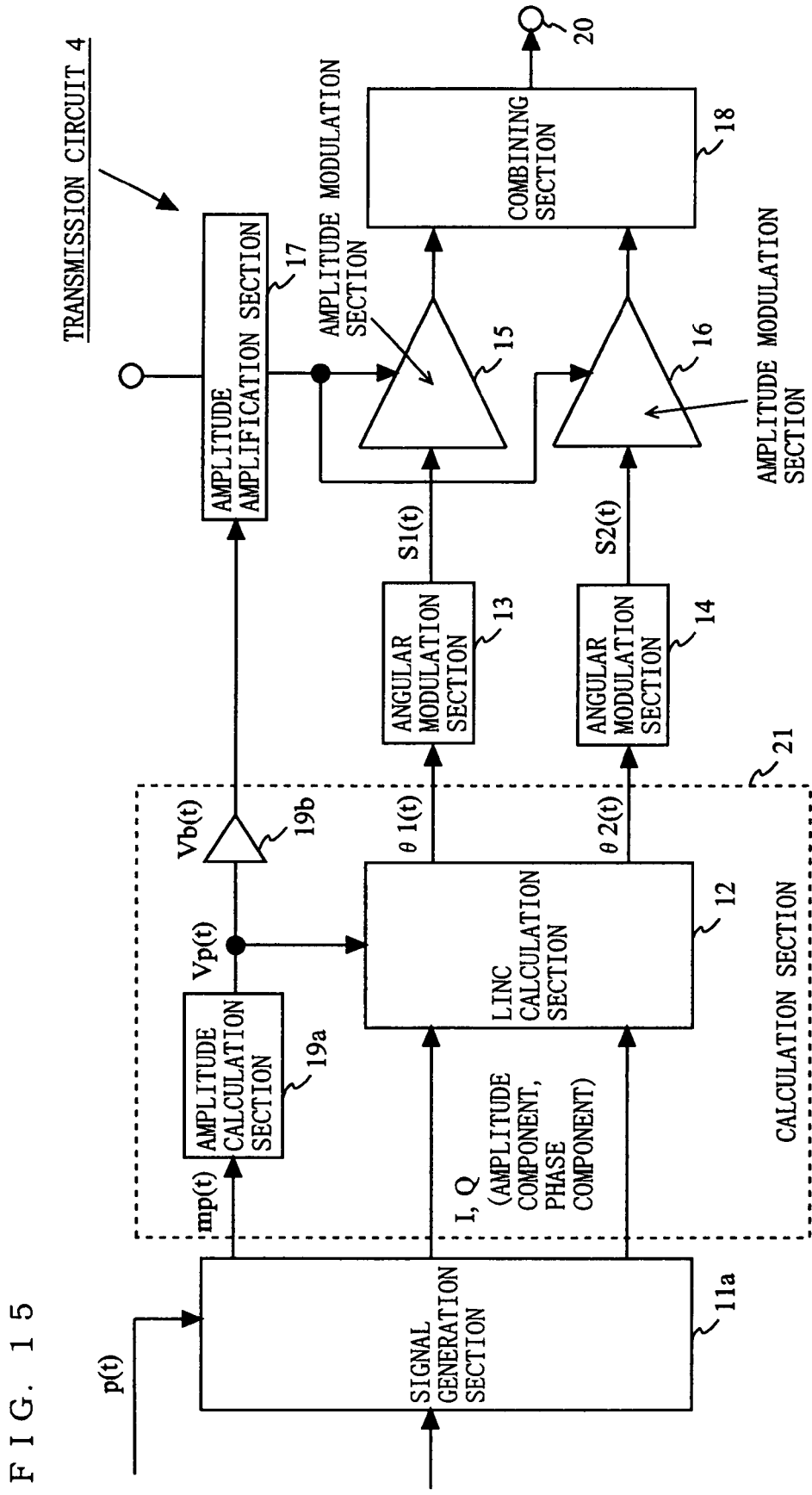
F I G. 1 5

TRANSMISSION CIRCUIT, AND COMMUNICATION APPARATUS USING THE SAME

BACKGROUND OF THE INVENTION

1. Field of the Invention

The present invention relates to a transmission circuit used for a communication apparatus such as a mobile phone, a wireless LAN device or the like, and more specifically to a compact transmission circuit for outputting a highly linear transmission signal regardless of the level of the output power and operating at a high efficiency, and a communication apparatus using the same.

2. Description of the Background Art

A communication apparatus such as a mobile phone, a wireless LAN device or the like is required to guarantee the linearity of the transmission signal while operating at a low power consumption whether the communication apparatus may operate at a high output power or a low output power. For such a communication apparatus, a compact transmission circuit for outputting a highly linear transmission signal and operating at a high efficiency regardless of the level of the output power is used. Conventional transmission circuits will be described below.

An exemplary conventional transmission circuit generates a transmission signal using a modulation system such as, for example, quadrature modulation (hereinafter, referred to as a "quadrature modulation circuit"). The quadrature modulation circuit is widely known and will not be described here. Another conventional transmission circuit for outputting a highly linear transmission signal at a higher efficiency than the quadrature modulation circuit is, for example, a transmission circuit 500 shown in FIG. 21. FIG. 21 is a block diagram showing a structure of the conventional transmission circuit 500. As shown in FIG. 21, the conventional transmission circuit 500 includes a signal generation section 501, an angular modulation section 502, an amplitude amplification section 503, an amplitude modulation section 504, and an output terminal 505.

In the conventional transmission circuit 500, the signal generation section 501 generates an amplitude signal and a phase signal. The amplitude signal is input to the amplitude amplification section 503. The amplitude amplification section 503 supplies a voltage controlled in accordance with the level of the input amplitude signal to the amplitude modulation section 504. The phase signal is input to the angular modulation section 502. The angular modulation section 502 performs angular modulation on the input phase signal, and outputs the resultant signal as an angle-modulated signal. The angle-modulated signal is input to the amplitude modulation section 504. The amplitude modulation section 504 performs amplitude modulation on the angle-modulated signal with the voltage supplied from the amplitude amplification section 503, and outputs the resultant signal as an angle-modulated and amplitude-modulated signal. This modulation signal is output from the output terminal 505 as a transmission signal. Such a transmission circuit 500 is referred to as a polar modulation circuit.

Still another conventional transmission circuit for outputting a highly linear transmission signal at a higher efficiency than the quadrature modulation circuit is, for example, a transmission circuit 600 which is referred to as a LINC (Linear Amplification using Nonlinear Components) circuit and shown in FIG. 22. FIG. 22 is a block diagram showing a structure of the conventional transmission circuit 600. As shown in FIG. 22, the conventional transmission circuit 600 includes a constant amplitude wave generation circuit 601, an amplification section 602, an amplification section 603, and a combining circuit 604.

The constant amplitude wave generation circuit 601 outputs two modulated signals having different phases and a constant amplitude (hereinafter, referred to as "constant amplitude signals") based on an input signal. The two constant amplitude signals which are output from the constant amplitude wave generation circuit 601 are amplified by the amplification sections 602 and 603 and input to the combining circuit 604. The combining circuit 604 combines an output signal s1 from the amplification section 602 and an output signal s2 from the amplification section 603, and outputs the combined signal as a transmission signal s0.

The transmission signal s0, the output signal s1 from the amplification section 602, and the output signal s2 from the amplification section 603 are represented by expressions (1) through (4). In expressions (1) through (4), M(t) represents an amplitude component of the transmission signal s0, and θ(t) represents the phase component of the transmission signal s0. Mx represents the level of the output signal s1 from the amplification section 602 and the level of the output signal s2 from the amplification section 603. ψ(t) represents the phase shift of the output signal s1 and the output signal s2 with respect to the transmission signal s0.

$$s0(t) = M(t)\exp[j\theta(t)] = s1(t) + s2(t) \quad \text{expression (1)}$$

$$s1(t) = \text{Mx}\exp[j\{\theta(t) + \phi(t)\}] \quad \text{expression (2)}$$

$$s2(t) = \text{Mx}\exp[j\{\theta(t) - \phi(t)\}] \quad \text{expression (3)}$$

$$\phi(t) = \cos^{-1}\left[\frac{M(t)}{2\text{Mx}}\right] \quad \text{expression (4)}$$

FIG. 23 specifically illustrates an operation of the conventional transmission circuit 600. The conventional transmission circuit 600 reduces the phase shift of the output signal s1 and the output signal s2 with respect to the transmission signal s0, and thus outputs a high transmission signal s0 (see FIG. 23, (a)). The conventional transmission circuit 600 enlarges the phase shift of the output signal s1 and the output signal s2 with respect to the transmission signal s0, and thus outputs a low transmission signal s0 (see FIG. 23, (b)). Namely, the transmission circuit 600 can control the phase shift of the two constant amplitude wave signals which are output from the constant amplitude generation circuit 601 to control the level of the transmission signal s0.

However, the conventional transmission circuit 600 generates a transmission signal s0 by combining the output signals s1 and s2. Therefore, when the output signal s1 or s2 includes a phase error or an amplitude error, it is difficult to output a desired transmission signal s0.

A conventional LINC transmission circuit for correcting the phase error or the amplitude error included in the output signal s1 or s2 is disclosed (for example, see Japanese Laid-Open Patent Publication No. 5-37263; hereinafter, referred to as "patent document 1"). FIG. 24 is a block diagram showing a structure of a conventional transmission circuit 700 disclosed in patent document 1. As shown in FIG. 24, the conventional transmission circuit 700 includes a constant amplitude wave generation circuit 601, an amplification section 602, an amplification circuit 603, a combining circuit 604, a phase detector 701, a variable phase device 702, an amplitude difference detector 703, and a variable attenuator 704.

In the conventional transmission circuit 700, the phase detector 701 detects a phase error included in the output signal s1 from the amplification section 602. The variable phase device 702 corrects the phase of the constant amplitude signal generated by the constant amplitude wave generation circuit 601 based on the detected phase error. The amplitude difference detector 703 detects an amplitude error included in the output signal s2 from the amplification section 603. The variable attenuator 704 corrects the amplitude of the constant amplitude signal generated by the constant amplitude wave generation circuit 601 based on the detected amplitude difference. Thus, the conventional transmission circuit 700 can output a desired transmission signal s0.

The conventional transmission circuit 500 (FIG. 21) has a problem of not being able to output a transmission signal having a level lower than that of a predetermined output power (i.e., there is a lower limit on the output power of the transmission signal). FIG. 25 shows an example of the output characteristics of the conventional transmission circuit 500. In FIG. 25, the horizontal axis represents the amplitude of the signal which is output from the signal generation section 501. The vertical axis represents the output power of the transmission signal. As shown in FIG. 25, in the conventional transmission circuit 500, the amplitude modulation section 504 cannot easily operate linearly in an area where the output power is low (i.e., where the level of the amplitude signal is low). Therefore, a highly linear transmission signal cannot be output in such an area.

The conventional transmission circuit 600 (FIG. 22) has the problem that because a transmission signal s0 is generated by combining two output signals s1 and s2 having different phases, it is difficult to output a desired transmission signal s0 due to a phase error or an amplitude error included in the output signal s1 or s2 as described above. The conventional transmission circuit 600 also has a problem that because a transmission signal s0 is generated by combining two output signals s1 and s1 having different phases, the operation efficiency is not guaranteed to be high when the level of the output power is of a certain value.

The conventional transmission circuit 700 (FIG. 24) requires many elements (for example, the phase detector 701, the variable phase device 702, the amplitude difference detector 703, and the variable attenuator 704) in order to correct the phase error or the amplitude error included in the output signal s1 or s2. Therefore, the conventional transmission circuit 700 has a problem of being large in circuit scale. The conventional transmission circuit 700 also has a problem that because the outputs from the amplification sections 602 and 603 are each branched, a loss is generated and the power consumption of the conventional transmission circuit 700 is increased.

SUMMARY OF THE INVENTION

Therefore, an object of the present invention is to provide a compact transmission circuit for outputting a highly linear transmission signal regardless of the level of the output power and operating at a high efficiency, and a communication apparatus using the same.

The present invention is directed to a transmission circuit for generating a transmission signal based on input data and outputting the transmission signal. In order to attain the above-described object, the transmission circuit comprises a signal generation section for modulating the input data to generate an amplitude signal representing an amplitude component of the input data and data of a predetermined form; a calculation section for performing a calculation using the amplitude signal and the data of the predetermined form, and outputting a discrete value having a level which is discrete at an interval of a predetermined time period, a first phase signal and a second phase signal; a first angular modulation section for performing angular modulation on the first phase signal, and outputting the resultant signal as a first angle-modulated signal; a first amplitude modulation section for performing amplitude modulation on the first angle-modulated signal with a signal in accordance with the level of the discrete value, and outputting the resultant signal as a first modulated signal; a second angular modulation section for performing angular modulation on the second phase signal, and outputting the resultant signal as a second angle-modulated signal; a second amplitude modulation section for performing amplitude modulation on the second angle-modulated signal with a signal in accordance with the level of the discrete value, and outputting the resultant signal as a second modulated signal; and a combining section for combining the first modulated signal and the second modulated signal, and outputting the resultant signal as a transmission signal. The calculation section compares the amplitude signal and a plurality of threshold values and outputs a discrete value having a level which is discrete at an interval of the predetermined time period; and calculates a phase component of the data of the predetermined form and outputs the first phase signal having the phase component shifted in one direction by a predetermined phase and the second phase signal having the phase component shifted in the other direction by the predetermined phase.

The calculation section comprises an amplitude calculation section for comparing n number of threshold values $2V_n$ having levels continuously increasing discretely and the amplitude signal at an interval of the predetermined time period, and when the amplitude signal has a level which is higher than one of two continuous threshold values, $2V_k$, and is equal to, or lower than, the other threshold value $2V_{k+1}$, outputting a discrete value $\alpha V_{k+1}$ obtained by multiplying the other threshold value $2V_{k+1}$ by a predetermine value $\alpha$; a LINC calculation section for calculating a phase component of the data of the predetermined form, calculating the predetermined phase by inverse-cosining a quotient obtained by dividing the level of the amplitude signal by the other threshold value $2V_{k+1}$, and outputting the first phase signal having the phase component shifted in one direction by the predetermined phase and the second phase signal having the phase component shifted in the other direction by the predetermined phase; and an amplification section for outputting a discrete value $\alpha \cdot \beta V_{k+1}$ obtained by multiplying the discrete value $\alpha V_{k+1}$ which is output from the amplitude calculation section by a predetermined value $\beta$.

Preferably, when at least one of sampling points of the amplitude signal exceeds the one threshold value $2V_k$ within the predetermined time period, the amplitude calculation section outputs a discrete value $\alpha V_{k+1}$ obtained by multiplying the other threshold value $2V_{k+1}$ by a predetermined value $\alpha$.

When a predetermined number of sampling points of the amplitude signal exceeds the one threshold value $2V_k$ within the predetermined time period, the amplitude calculation section may output a discrete value $\alpha V_{k+1}$ obtained by multiplying the other threshold value $2V_{k+1}$ by a predetermined value $\alpha$.

The amplitude calculation section may comprise an amplitude limiting section for, when the amplitude signal has a level which is higher than the one threshold value $2V_k$, outputting an amplitude signal having a level limited to the one threshold value $2V_k$; and an amplitude processing section for, when the amplitude signal which is output from the amplitude limiting section has a level which is equal to the one threshold value $2V_k$, outputting a discrete value $2V_{k+1}$ obtained by multiplying the other threshold value $2V_{k+1}$ by a predetermined value $\alpha$.

Preferably, calculation section comprises an amplitude calculation section for comparing n number of threshold values $2V_n$ having levels continuously increasing discretely and the amplitude signal at an interval of the predetermine time period, and when the amplitude signal has a level which is higher than one of two continuous threshold values, $2V_k$, and is equal to, or lower than, the other threshold value $2V_{k+1}$, outputting a discrete value $V_{k+1}$ which is half of the other threshold value $2V_{k+1}$; and a LINC calculation section for calculating a phase component of the data of the predetermined form, calculating the predetermined phase by inverse-cosining a quotient obtained by dividing the level of the amplitude signal by the other threshold value $2V_{k+1}$, and outputting the first phase signal having the phase component shifted in one direction by the predetermined phase and the second phase signal having the phase component shifted in the other direction by the predetermined phase.

Preferably, the transmission circuit further comprises an amplitude amplification section to which the discrete value is input from the calculation section. In this case, the amplitude amplification section supplies a signal controlled in accordance with the level of the discrete value to the first amplitude modulation section and the second amplitude modulation section; the first amplitude modulation section performs amplitude modulation on the first angle-modulated signal with the signal which is output from the amplitude amplification section, and outputs the resultant signal as the first modulated signal; and the second amplitude modulation section performs amplitude modulation on the second angle-modulated signal with the signal which is output from the amplitude amplification section, and outputs the resultant signal as the second modulated signal.

The predetermined time period is longer than a symbol time of the transmission signal and is shorter than a unit time used for transmission power information indicating a level of an output power of the transmission signal.

Preferably, when an envelope of the transmission signal changes a little, the calculation section changes the predetermined time period to be longer; and when the envelope of the transmission signal changes much, the calculation section changes the predetermined time period to be shorter.

The amplitude amplification section is a switching regulator. Alternatively, the amplitude amplification section may be a series regulator. Still alternatively, the amplitude amplification section includes a switching regulator and a series regulator connected to each other in series.

Preferably, the transmission circuit further comprises a timing control section connected on a stage after the calculation section for controlling the timing for outputting the discrete value from the calculation section to be advanced. In this case, the switching regulator supplies a voltage controlled in accordance with the level of the discrete value which is output from the timing control section to the series regulator; and the series regulator supplies a voltage controlled in accordance with the level of the discrete value which is output from the calculation section to the first amplitude modulation section and the second amplitude modulation section.

The transmission circuit may further comprise a timing control section connected on a stage after the calculation section for controlling the timing for outputting the discrete value from the calculation section; a first variable gain amplification section connected on a stage after the first angular modulation section for amplifying the first angle-modulated signal with a gain in accordance with the level of the discrete value; and a second variable gain amplification section connected on a stage after the second angular modulation section for amplifying the second angle-modulated signal with a gain in accordance with the level of the discrete value. In this case, the switching regulator supplies a voltage controlled in accordance with the level of the discrete value which is output from the timing control section to the first amplitude modulation section and the second amplitude modulation section.

Transmission power information indicating a level of an output power of the transmission signal is input to the signal generation section. In this case, the signal generation section changes the level of the amplitude signal such that the amplitude signal has a positive characteristic with respect to the level of the output power indicated by the transmission power information.

The transmission circuit may further comprise a multiplication section to which transmission power information indicating a level of an output power of the transmission signal is input, the multiplication section being connected at a stage after the calculation section. In this case, the multiplication section changes the level of the discrete value which is output from the calculation section such that the discrete value has a positive characteristic with respect to the level of the output power indicated by the transmission power information.

The amplitude amplification section includes a switching regulator and a series regulator connected to each other in series. In this case, the transmission power information is input to the switching regulator, and the switching regulator supplies a voltage controlled in accordance with the input transmission power information to the series regulator; and the series regulator supplies a voltage controlled in accordance with the level of the discrete value which is output from the calculation section to the first amplitude modulation section and the second amplitude modulation section.

Preferably, the transmission circuit further comprises a timing control section connected on a stage after the multiplication section for advancing the timing for outputting the discrete value from the multiplication section. In this case, the amplitude amplification section includes a first switching regulator, a second switching regulator and a series regulator connected to each other in series; the transmission power information is input to the first switching regulator, and the first switching regulator supplies a voltage controlled in accordance with the input transmission power information to the second switching regulator; the second switching regulator supplies a voltage controlled in accordance with the level of the discrete value which is output from the timing control section to the series regulator; and the series regulator supplies a voltage controlled in accordance with the level of the discrete value which is output from the multiplication section to the first amplitude modulation section and the second amplitude modulation section.

The transmission circuit further comprises a first variable gain amplification section and a second variable gain amplification section, to each of which a discrete value is input from the calculation section. In this case, the first variable gain amplification section amplifies the first angle-modulated signal with a gain in accordance with the level of the discrete value, and outputs the amplified first angle-modulated signal to the first amplitude modulation section; and the second variable gain amplification section amplifies the second angle-modulated signal with a gain in accordance with the level of the discrete value, and outputs the amplified second angle-modulated signal to the second amplitude modulation section.

The transmission circuit may further comprise a predistortion section, provided at an output of the calculation section, for compensating at least one of the discrete value, the first phase signal and the second phase signal so as to suppress a distortion caused in at least one of the first angular modulation section, the second angular modulation section, the first amplitude modulation section, the second amplitude modulation section, and the amplitude amplification section.

The present invention is also directed to a communication apparatus including the above-described transmission circuit. The communication apparatus comprises a transmission circuit for generating a transmission signal; and an antenna for outputting the transmission signal generated by the transmission circuit. The communication apparatus may further comprise a receiving circuit for processing a receiving signal received from the antenna; and an antenna duplexer for outputting the transmission signal generated by the transmission circuit to the antenna, and outputting the receiving signal received from the antenna to the receiving circuit.

As described above, according to the present invention, the amplitude calculation section compares the amplitude signal and the plurality of threshold values at an interval of a predetermined time period, and outputs a value having a level changing discretely in accordance with the amplitude signal as a discrete value. Therefore, the transmission circuit can combine the first modulated signal and the second modulated signal each having a level changing discretely in accordance with the level of the amplitude signal, and can output the combined signal as a transmission signal. Thus, the transmission circuit can operate at a high efficiency while being compact in size, and output a highly linear transmission signal regardless of the level of the output power.

The transmission circuit does not branch the signal output from the first amplitude modulation section or the second amplitude modulation section into a plurality of components. Therefore, the transmission circuit can suppress the loss caused by the branching of the signal and thus can reduce the power consumption of the transmission circuit.

The transmission circuit uses a switching regulator operable at a high efficiency or a series regulator operable at a high speed as the amplitude amplification section, to control the voltage to be supplied to the first amplitude modulation section and the second amplitude modulation section. Therefore, the transmission circuit can operate at a high efficiency or at a high speed. The transmission circuit combines a switching regulator operable at a high efficiency and a series regulator operable at a high speed, to control the voltage to be supplied to the first amplitude modulation section and the second amplitude modulation section. Therefore, the transmission circuit can operate at a higher efficiency and a higher speed.

The transmission circuit includes a timing control section for controlling the timing for outputting the discrete value from the calculation section, and therefore can operate at a high efficiency and a high speed even when a series regulator is used as the amplitude amplification section.

The transmission circuit changes the level of the amplitude signal such that the amplitude signal has a positive characteristic with respect to the level of the output power indicated by the input transmission power information. Therefore, the transmission circuit can output a highly linear transmission signal even when the level of the output power indicated by the input transmission power information changes much.

A communication apparatus according to the present invention uses the above-described transmission circuit, and thus can guarantee the high precision of the output signal over a wide bandwidth range and operate at a high efficiency while being compact in size.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10 shows an exemplary timing diagram of signals handled by the transmission circuit 2;

FIG. 11 is a block diagram showing an exemplary structure of a transmission circuit 3 according to a third embodiment of the present invention;

FIG. 15 is a block diagram showing an exemplary structure of a transmission circuit 4 according to a fourth embodiment of the present invention;

DESCRIPTION OF THE PREFERRED EMBODIMENTS

First Embodiment

Figure 1A:
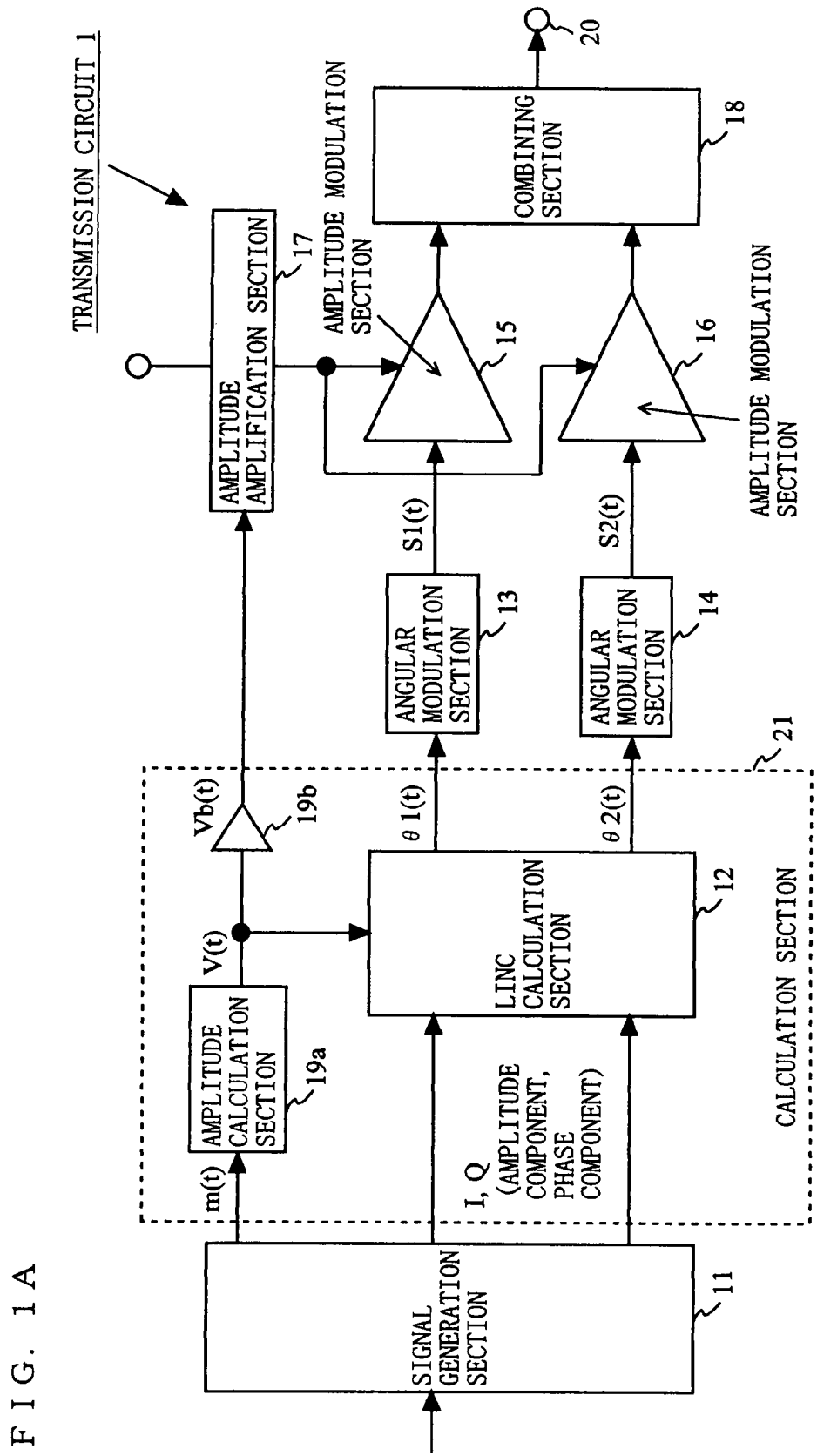
FIG. 1A is a block diagram showing an exemplary structure of a transmission circuit 1 according to a first embodiment of the present invention.

FIG. 1A is a block diagram showing an exemplary structure of a transmission circuit 1 according to a first embodiment of the present invention. As shown in FIG. 1A, the transmission circuit 1 includes a signal generation section 11, a LINC calculation section 12, an angular modulation section 13, an angular modulation section 14, an amplitude modulation section 15, an amplitude modulation section 16, an amplitude amplification section 17, a combining section 18, an amplitude calculation section 19a, an amplification section 19b, and an output terminal 20. The LINC calculation section 12, the amplitude calculation section 19a and the amplification section 19b may be represented as being included in a calculation section 21.

The signal generation section 11 modulates input data to generate signals of a predetermined form and an amplitude signal m(t). The signals of a predetermined form are I and Q signals, which are quadrature signals. The amplitude signal m(t) is represented by expression (5). The signals of the predetermined form may be signals represented by an amplitude component and a phase component.

$$m(t) = \sqrt{I(t)^2 + Q(t)^2} \qquad \text{expression (5)}$$

The amplitude signal m(t) is input to the amplitude calculation section 19a. The amplitude calculation section 19a compares the amplitude signal m(t) and a plurality of threshold values $2V_n$ at an interval of a predetermined time period, and outputs a discrete value V(t) having one of a plurality of values. The discrete value V(t) has one of $V_1, V_2, V_3 \ldots V_k, V_{k+1} \ldots V_n$ at an interval of the predetermined time period, where $V_1 < V_2 < V_3 \ldots < V_k < V_{k+1} \ldots V_n$. n and k are each an arbitrary natural number, and k≦n. The amplitude signal m(t) and the discrete value V(t) have the relationship represented by expression (6). The operation of the amplitude calculation section 19a will be specifically described below.

$$2V_k < m(t) \leq 2V_{k+1}$$

$$V(t) = V_{k+1} \qquad \text{expression (6)}$$

The amplitude calculation section 19a may output a discrete value V(t) obtained by multiplying $V_1, V_2, V_3 \ldots V_k, V_{k+1} \ldots V_n$ by α. In this case, the amplitude signal m(t) and the discrete value V(t) have the relationship represented by expression (7). α is equal to or more than 1 arbitrary real number.

$$2V_k < m(t) \leq 2V_{k+1}$$

$$V(t) = \alpha V_{k+1} \qquad \text{expression (7)}$$

The signal generation section 11 may modulate the input data and output only the I and Q signals. In this case, the I and Q signals are input to the amplitude calculation section 19a instead of the amplitude signal m(t). The amplitude calculation section 19a may generate an amplitude signal m(t) from the I and Q signals by, for example, the calculation represented by expression (5).

The I and Q signals and the discrete signal V(t) are input to the LINC calculation section 12. The LINC calculation section 12 performs predetermined calculation processing based on the I and Q signals and the discrete signal V(t) to generate a first phase signal θ1(t) represented by expression (8) and a second phase signal θ2(t) represented by expression (9). θ(t) is obtained by expression (10), and ϕ is obtained by expression (11).

$$\theta 1(t) = \theta(t) + \phi(t) \qquad \text{expression (8)}$$

$$\theta 2(t) = \theta(t) - \phi(t) \qquad \text{expression (9)}$$

$$\theta(t) = \arg(I(t) + jQ(t)) = \tan^{-1}(Q(t)/I(t)) \qquad \text{expression (10)}$$

$$\phi(t) = \cos^{-1}\left[\frac{m(t)}{2V(t)}\right] \qquad \text{expression (11)}$$

The discrete value V(t) is input to the amplification section 19b. The amplification section 19b multiplies the discrete value V(t) by β, and outputs the resultant value as a discrete value Vb(t) represented by expression (12). β is an arbitrary real number.

$$Vb(t) = \beta V(t) \qquad \text{expression (12)}$$

The discrete value Vb(t) is input to the amplitude amplification section 17. The amplitude amplification section 17 outputs a signal controlled by the discrete value Vb(t). The signal which is output from the amplitude amplification section 17 is input to the amplitude modulation sections 15 and 16.

The first phase signal θ1(t) is input to the angular modulation section 13. The angular modulation section 13 performs angular modulation on the first phase signal θ1(t), and outputs the resultant signal as a first angle-modulated signal S1(t). The second phase signal θ2(t) is input to the angular modulation section 14. The angular modulation section 14 performs angular modulation on the second phase signal θ2(t), and outputs the resultant signal as a second angle-modulated signal S2(t). The first angle-modulated signal S1(t) and the second angle-modulated signal S2(t) are represented by expressions (13) and (14), respectively. A is an arbitrary constant.

$$S1(t) = A\exp[j\{\theta(t) + \phi(t)\}] \qquad \text{expression (13)}$$

$$S2(t) = A\exp[j\{\theta(t) - \phi(t)\}] \qquad \text{expression (14)}$$

The first angle-modulated signal S1(t) is input to the amplitude modulation section 15. The amplitude modulation section 15 performs amplitude modulation on the first angle-modulated signal S1(t) with the signal which is input from the amplitude amplification section 17, and outputs the resultant signal as a first modulated signal. The first modulated signal is input to the combining section 18. The second angle-modulated signal S2(t) is input to the amplitude modulation section 16. The amplitude modulation section 16 performs amplitude modulation on the second angle-modulated signal S2(t) with the signal which is input from the amplitude amplification section 17, and outputs the resultant signal as a second modulated signal. The second modulated signal is input to the combining section 18. The combining section 18 combines the first modulated signal and the second modulated signal, and outputs the resultant signal as a transmission signal. The transmission signal is output from the output terminal 20.

Figure 1B:
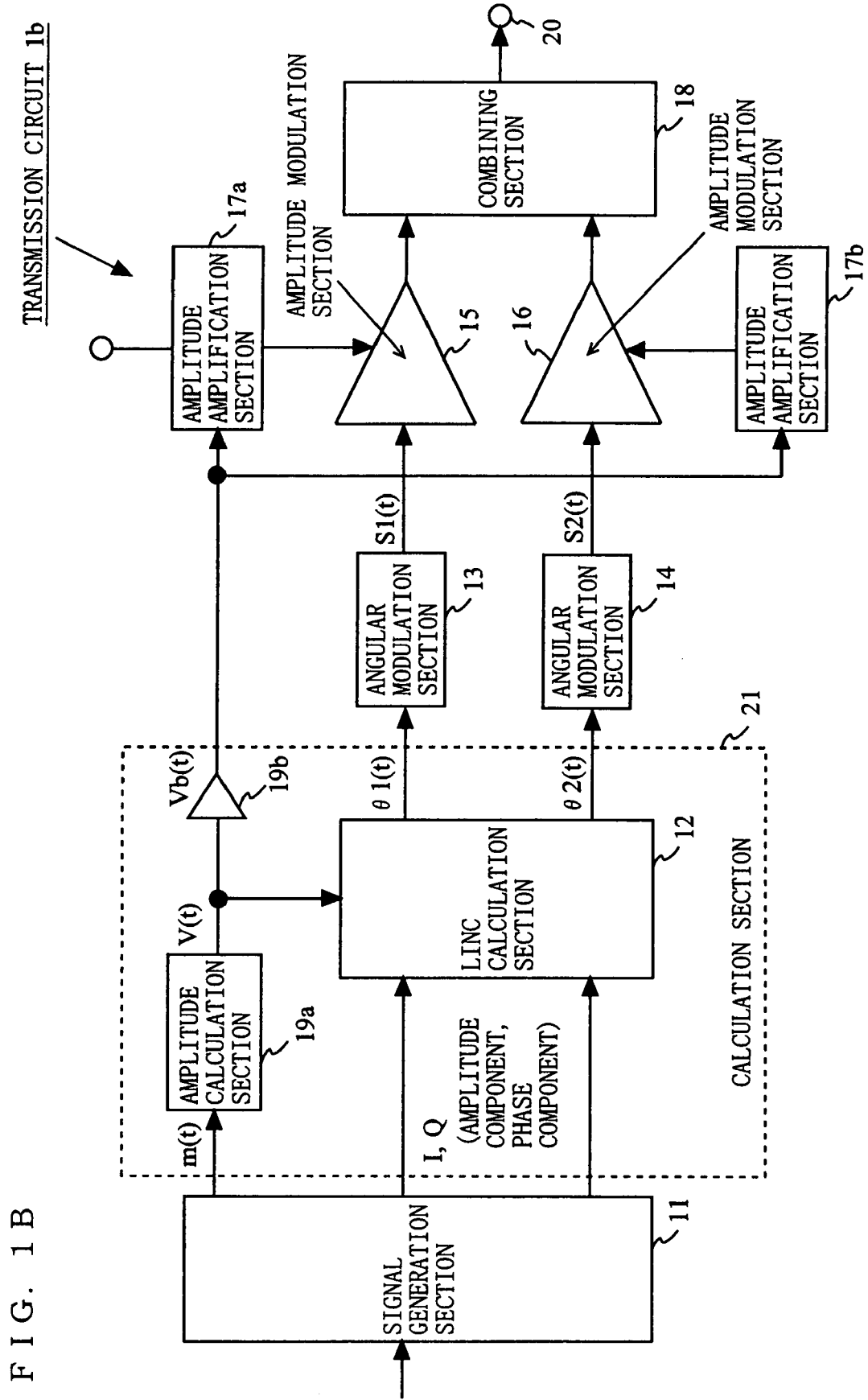
FIG. 1B is a block diagram showing an exemplary structure of a transmission circuit 1*b* according to the first embodiment of the present invention.

In the transmission circuit 1 shown in FIG. 1A, a signal controlled in accordance with the level of the discrete value Vb(t) is supplied to the amplitude modulation sections 15 and 16 commonly from the amplitude amplification section 17. Alternatively, as in a transmission circuit 1b shown in FIG. 1B, a signal controlled in accordance with the level of the discrete value Vb(t) may be supplied to the amplitude modulation sections 15 and 16 from different amplitude amplification sections 17a and 17b. FIG. 1B is a block diagram showing an exemplary structure of the transmission circuit 1b according to the first embodiment of the present invention. As shown in FIG. 1B, in the transmission circuit 1b, a signal controlled in accordance with the level of the discrete value Vb(t) is supplied to the amplitude modulation section 15 from the amplitude amplification section 17a, and a signal controlled in accordance with the level of the discrete value Vb(t) is supplied to the amplitude modulation section 16 from the amplitude amplification section 17b.

Figure 1C:
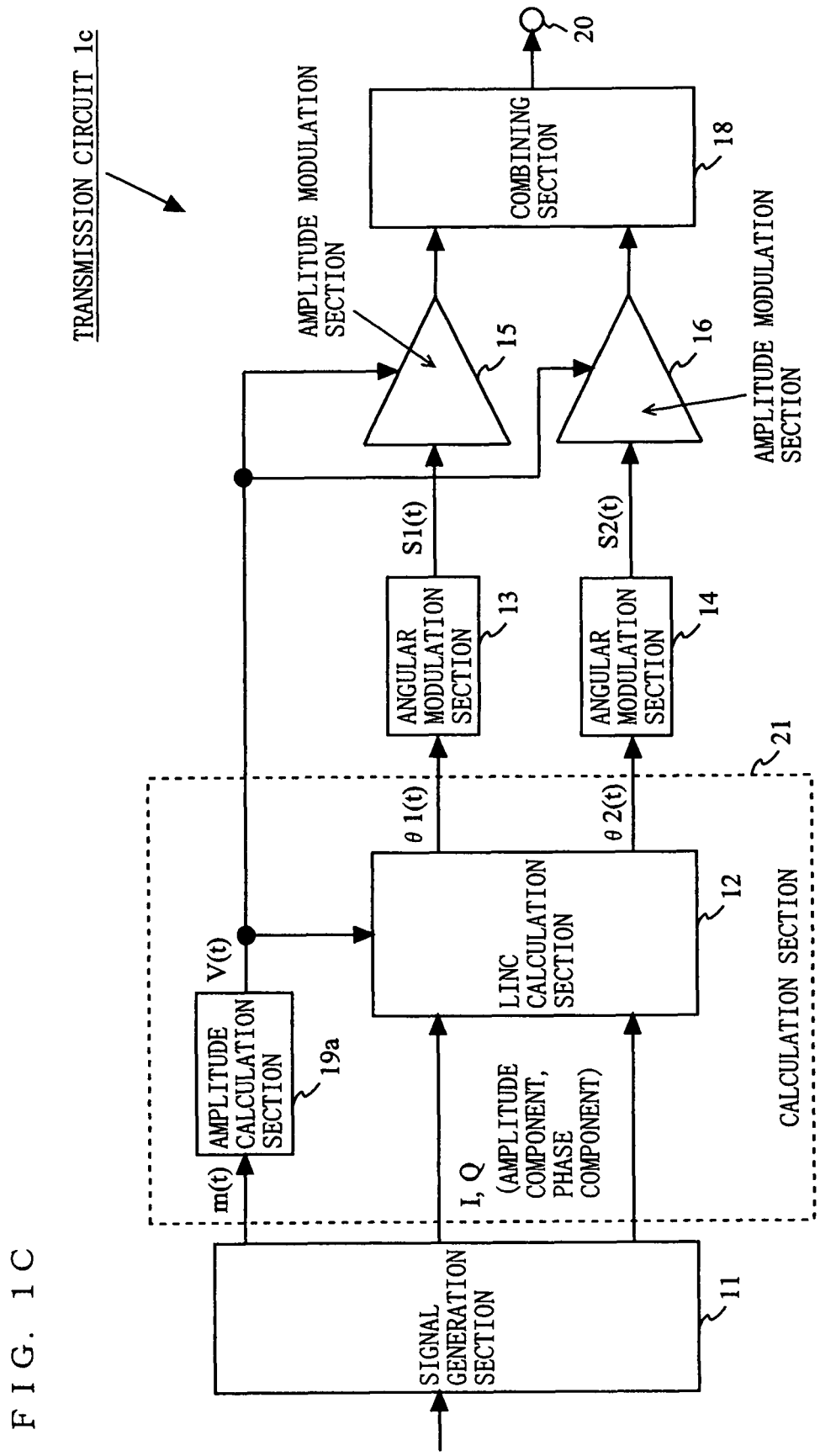
FIG. 1C is a block diagram showing an exemplary structure of a transmission circuit 1*c* according to the first embodiment of the present invention.

In the transmission circuit 1 shown in FIG. 1A, a signal controlled in accordance with the level of the discrete value Vb(t) is supplied to the amplitude modulation sections 15 and 16 from the amplitude amplification section 17. Alternatively, as in a transmission circuit 1c shown in FIG. 1C, the amplification section 19b and the amplitude amplification section 17 may be omitted. In this case, the discrete value V(t) is input to the amplitude modulation sections 15 and 16 from the calculation section 21. FIG. 1C is a block diagram showing an exemplary structure of the transmission circuit 1c according to the first embodiment of the present invention. As shown in FIG. 1C, in the transmission circuit 1c, the signal modulation section 15 performs amplitude modulation on the first angle-modulated signal S1(t) with the discrete value V(t), and outputs the resultant signal as a first modulated signal. The signal modulation section 16 performs amplitude modulation on the second angle-modulated signal S2(t) with the discrete value V(t), and outputs the resultant signal as a second modulated signal.

Figure 2A:
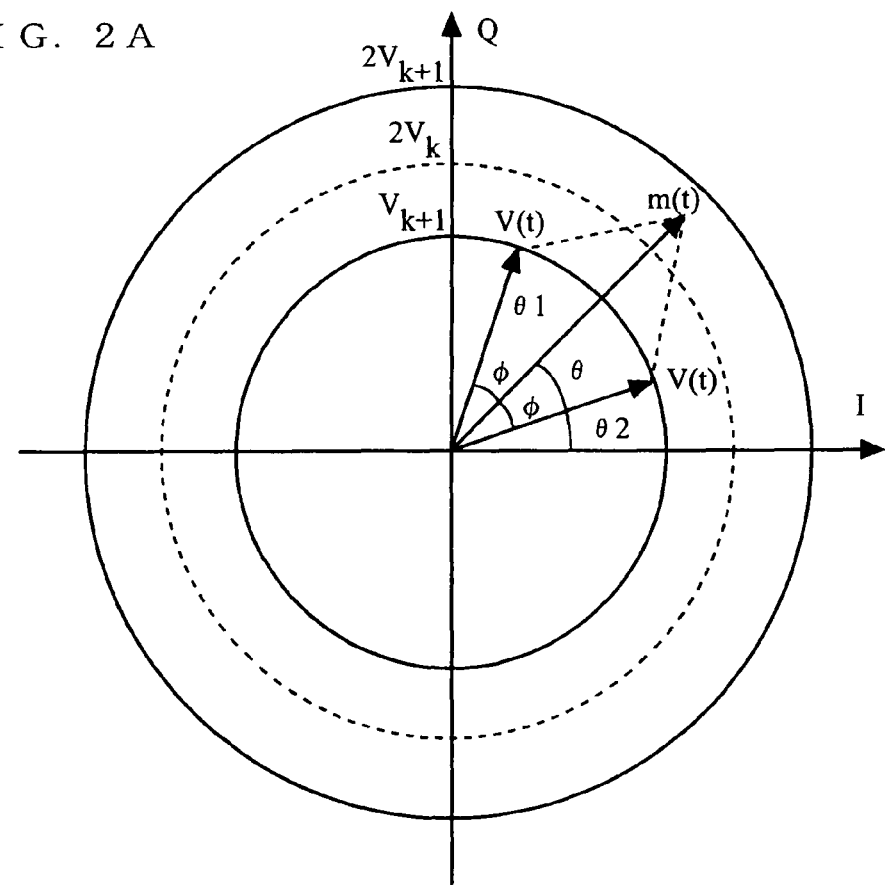
FIG. 2A illustrates the operation of the transmission circuit 1 in the case where the level of an amplitude signal m(t) is high.
Figure 2B:
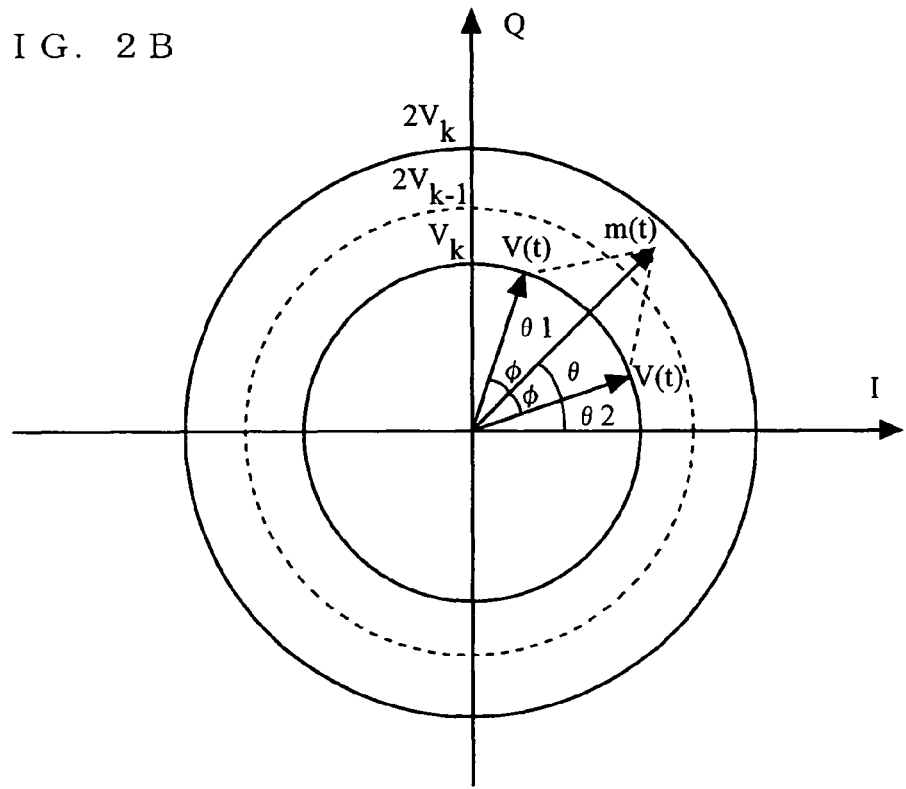
FIG. 2B illustrates the operation of the transmission circuit 1 in the case where the level of the amplitude signal m(t) is low.

Next, with reference to FIG. 2A, FIG. 2B and FIG. 3, the difference between the transmission circuit 1 according to the first embodiment and the conventional LINC transmission circuit will be described. FIG. 2A illustrates the operation of the transmission circuit 1 in the case where the level of the amplitude signal m(t) is high (i.e., the level of the envelope of the transmission signal is high). It is assumed that in FIG. 2A, the amplitude signal m(t) and a plurality of threshold values $2V_n$ have the relationship represented by expression (15). FIG. 2B illustrates the operation of the transmission circuit 1 in the case where the level of the amplitude signal m(t) is low (i.e., the level of the envelope of the transmission signal is low). It is assumed that in FIG. 2B, the amplitude signal m(t) and the plurality of threshold values $2V_n$ have the relationship represented by expression (16).

$2V_k < m(t) \leq 2V_{k+1}$ \hfill expression (15)

$2V_{k-1} < m(t) \leq 2V_k$ \hfill expression (16)

In FIG. 2A, the large circle drawn with a solid line represents the range of the level of the threshold value $2V_{k+1}$. The small circle drawn with a solid line represents the range of the level of the threshold value $V_{k+1}$, which is half of the threshold value $2V_{k+1}$. The circle drawn with a dashed line represents the range of the threshold value $2V_k$. Referring to FIG. 2A, in the case where the level of the amplitude signal m(t) fulfills expression (15), the relationship between the amplitude signal m(t) and the phase signal θ(t) is shown by a signal represented with the long solid-line arrow. The relationship between the discrete value V(t) and the first phase signal θ(t), and the relationship between the discrete value V(t) and the second phase signal θ2(t), are shown by signals represented with the short solid-line arrows, respectively.

In FIG. 2B, the large circle drawn with a solid line represents the range of the level of the threshold value $2V_k$. The small circle drawn with a solid line represents the range of the level of the threshold value $V_k$ (i.e., the discrete value V(t)), which is half of the threshold value $2V_k$. The circle drawn with a dashed line represents the range of the threshold value $2V_{k-1}$. Referring to FIG. 2B, in the case where the level of the amplitude signal m(t) fulfills expression (16), the relationship between the amplitude signal m(t) and the phase signal θ(t) is shown by a signal represented with the long solid-line arrow. The relationship between the discrete value V(t) and the first phase signal θ1(t), and the relationship between the discrete value V(t) and the second phase signal θ2(t), are shown by signals represented with the short solid-line arrows, respectively.

Referring to FIG. 2A and FIG. 2B, the transmission circuit 1 according to the first embodiment compares the amplitude signal m(t) and a plurality of threshold values $2V_n$ ($2V_1$, $2V_2$, $2V_3$ ... $2V_{k-1}$, $2V_k$, $2V_{k+1}$ ... $2V_n$) and thus changes the level of the discrete value V(t) to be output. Therefore, the maximum possible value θmax of θ(t) is represented by expression (17), regardless of the level of the amplitude m(t).

$$\phi\max = \cos^{-1}\left[\frac{V_{n-1}}{V_n}\right]$$ \hfill expression (17)

Figure 23:
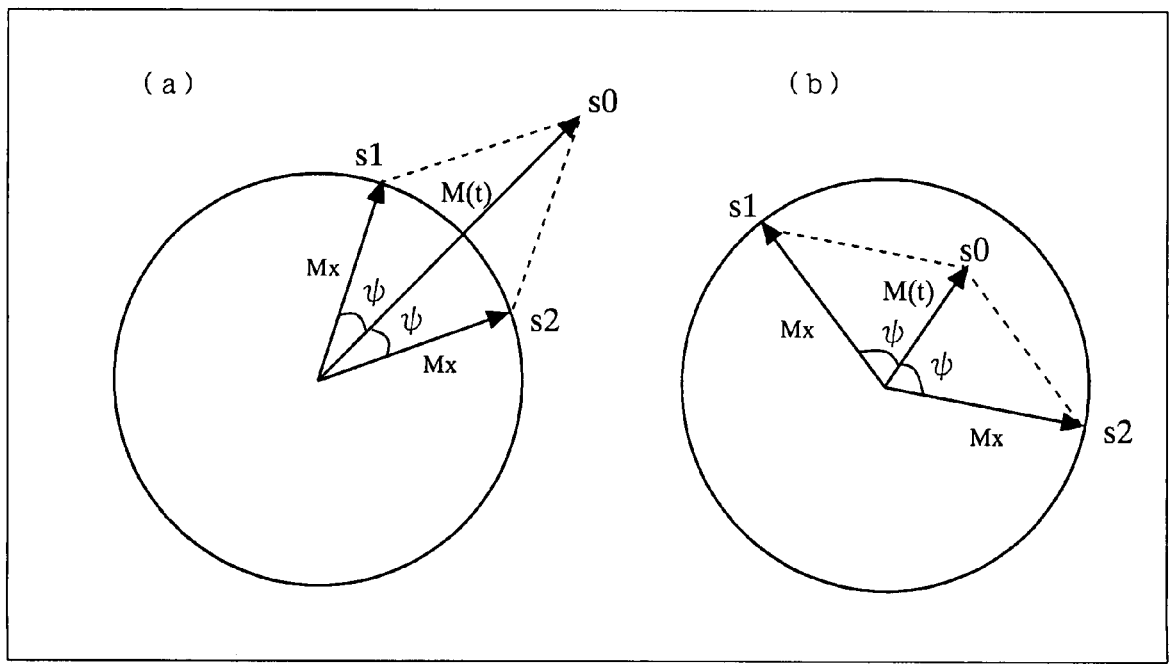
FIG. 23 is a block diagram showing a structure of a conventional transmission circuit 700.
Figure 24:
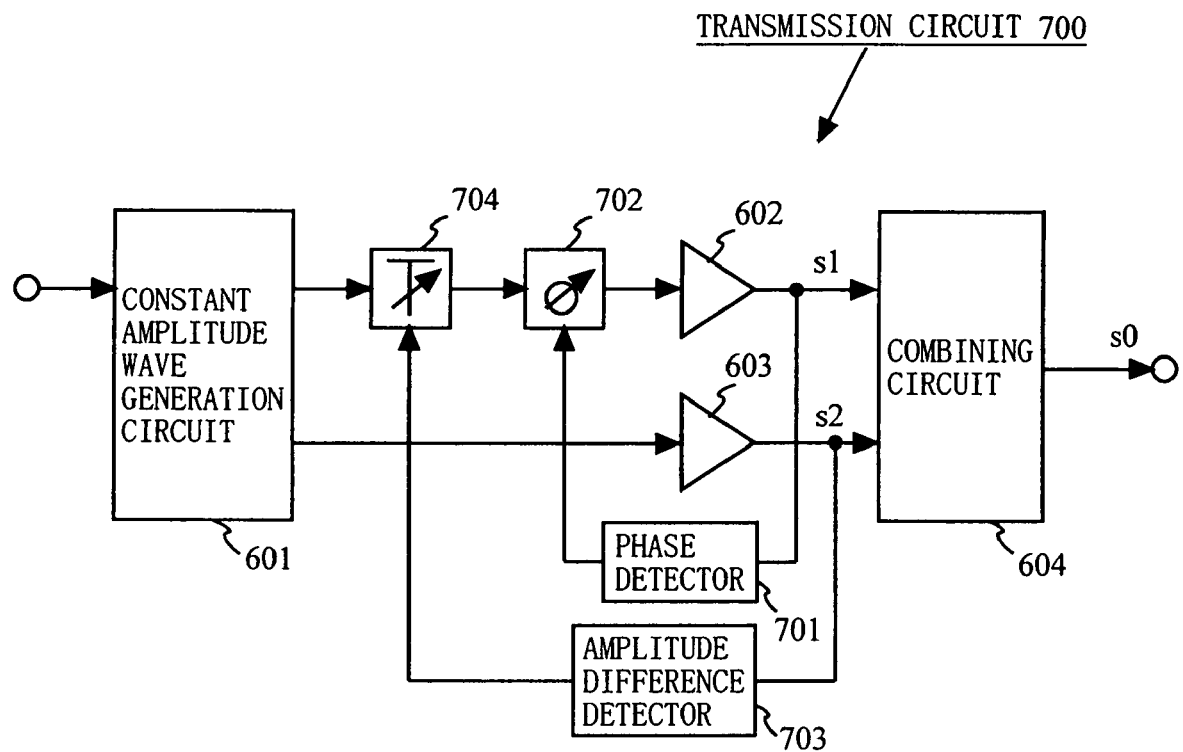
FIG. 24 is a block diagram showing a structure of a conventional transmission circuit 700.
Figure 25:
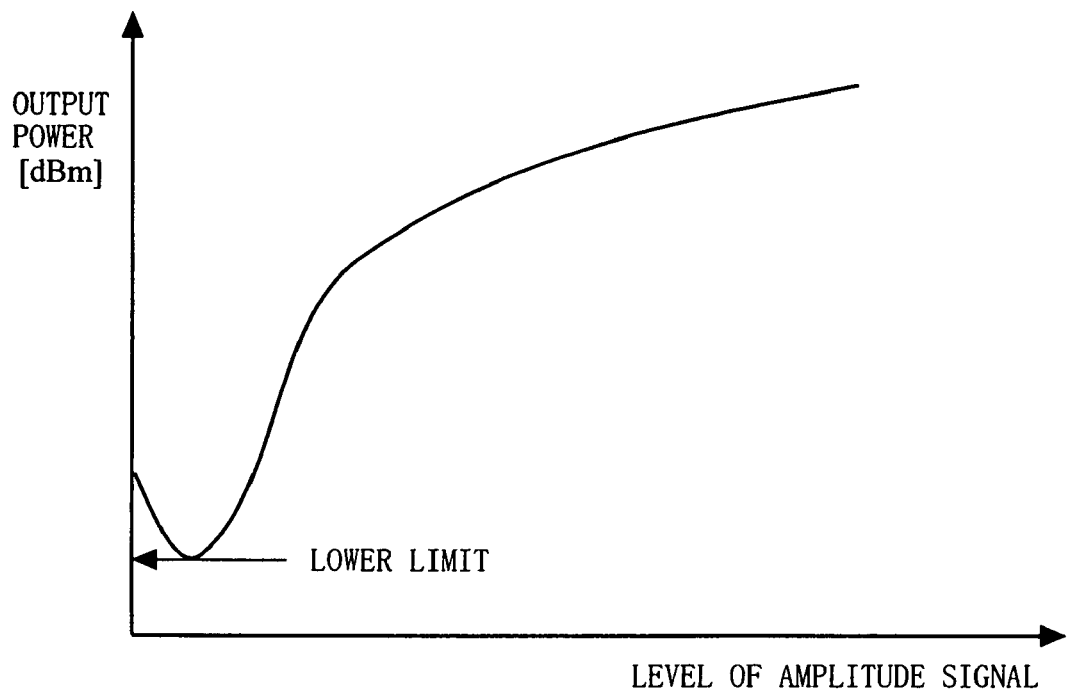
FIG. 25 shows an example of the output characteristics of the conventional transmission circuit 500.

In the conventional LINC transmission circuit, as shown in (a) and (b) of FIG. 23, as the level of the amplitude component M(t) of the transmission signal decreases, ψ(t) needs to be increased. As described above, ψ(t) is represented by expression (4). The transmission circuit according to the first embodiment, which can combine two signals having little phase shift regardless of the level of the amplitude signal m(t), can operate at a higher efficiency than the conventional LINC transmission circuit.

Figure 3:
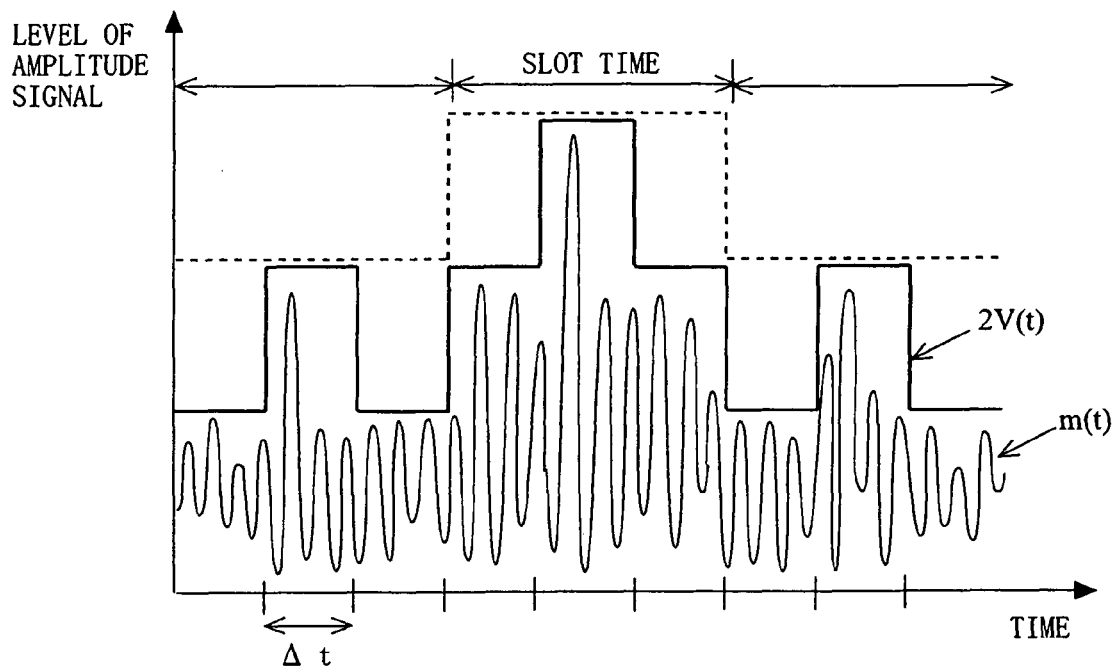
FIG. 3 illustrates the relationship between the discrete value V(t) and the amplitude signal m(t)

FIG. 3 illustrates the relationship between the discrete value V(t) and the amplitude signal m(t). As shown in FIG. 3, the amplitude calculation section 19a compares the amplitude signal m(t) and the plurality of threshold values $2V_n$ at an interval of a predetermined time period Δt, and outputs a discrete value V(t) relying on the level of the envelope of the transmission signal. In FIG. 3, the solid line shows 2V(t), which is twice the discrete value V(t), in order to show the relationship between the discrete value V(t) and the amplitude signal m(t) more easily to understand. The dashed line shows a value obtained by doubling the discrete value which is output in the case where slot time is used instead of the predetermined time period Δ(t). The "slot time" is a unit time used for transmission power information which indicates the level of the output power of the transmission signal.

As shown in FIG. 3, the amplitude calculation section 19a sets the predetermined time period Δ(t) to be longer than a symbol time and shorter than the slot time. Namely, the transmission circuit 1 can control the power of the transmission signal at an interval of the predetermined time period Δ(t), and thus can reduce the power consumption than in the case where the power of the transmission signal is controlled at an interval of the slot time. In the W-CDMA system, 666 μsec. is used as the slot time, and 0.26 μsec. (1/3.84 MHz) is used as the symbol time.

Figure 4:
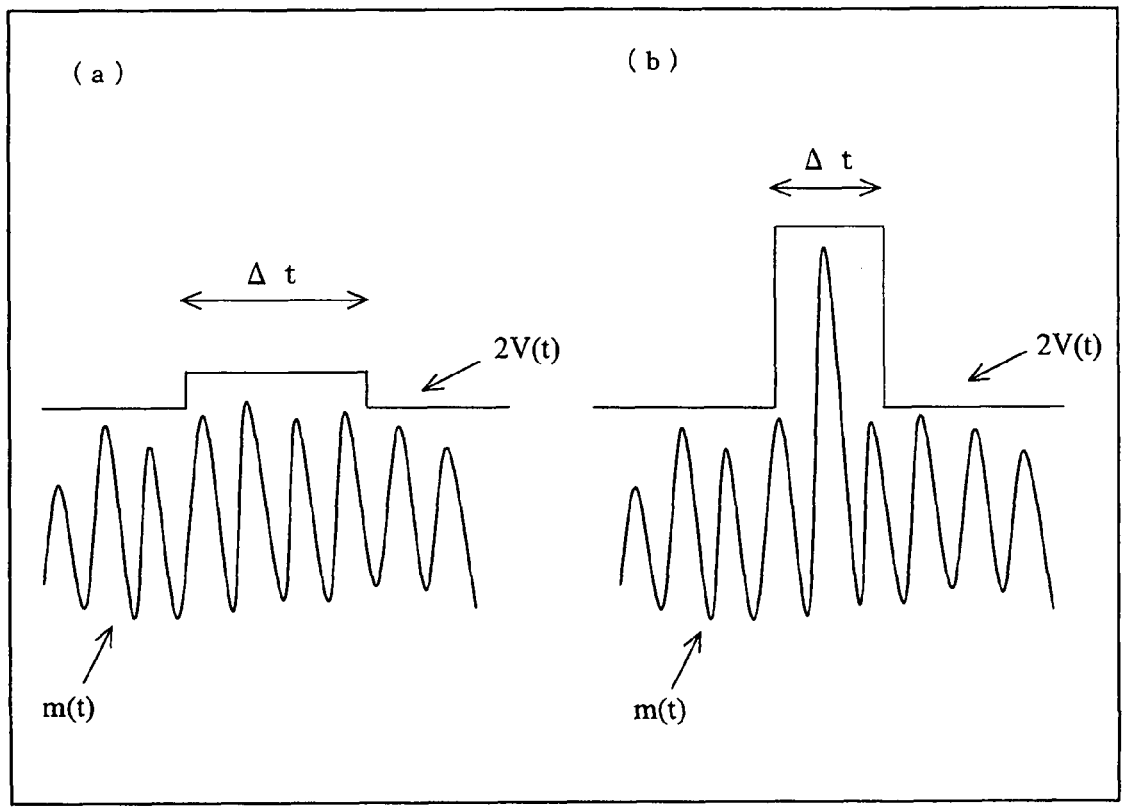
FIG. 4 illustrates the reduction in the power consumption when the length of the predetermined time period Δt is changed.

In order to further reduce the power consumption of the transmission circuit 1, the amplitude calculation section 19a may change the length of the predetermined time period Δ(t) when the transmission signal is of a certain modulation mode. FIG. 4 shows the reduction in the power consumption in the case where the length of the predetermined time period Δ(t) is changed. As shown in FIG. 4, (a), in the case where the level of the envelope of the transmission signal does not change much, the power consumption is not reduced much even when the amplitude calculation section 19a shortens the predetermined time period Δ(t). Therefore, the amplitude calculation section 19a changes the predetermined time period Δ(t) to be relatively long. As shown in FIG. 4, (b), in the case where the level of the envelope of the transmission signal changes much, the power consumption is reduced much when the amplitude calculation section 19a shortens the predetermined time period Δ(t). For example, the level of the envelope of the transmission signal changes more in the 16 QAM modulation mode than in the QPSK modulation mode. Therefore, the amplitude calculation section 19a shortens the predetermined time period Δ(t) in the 16 QAM modulation mode. Thus, the amplitude calculation section 19a can further reduce the power consumption of the transmission circuit 1.

Next, methods by which the amplitude calculation section 19a compares the amplitude signal m(t) and the plurality of threshold values $2V_n$ will be described.

(First Comparison Method)

Figure 5:
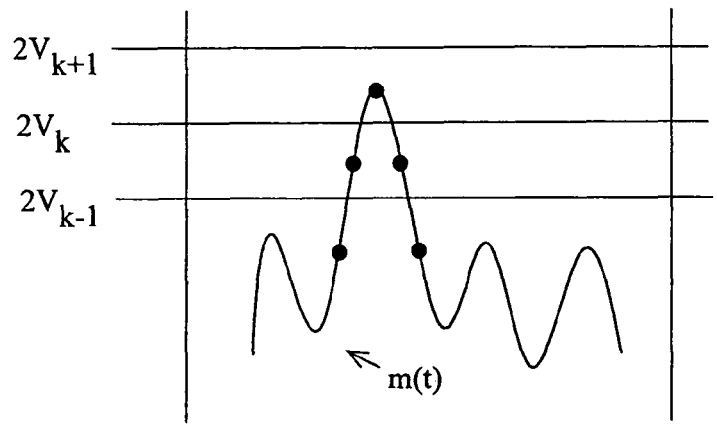
FIG. 5 shows an example of a first comparison method used by an amplitude calculation section 19*a*.

FIG. 5 shows an example of a first comparison method used by the amplitude calculation section 19a. The first comparison method is performed as follows. The amplitude calculation section 19a samples the amplitude signal m(t) at an interval of a very short time period. Next, when, for example, at least one of the sampling points of the amplitude signal m(t) exceeds the threshold value $2V_k$ within the predetermined time period Δ(t), the amplitude calculation section 19a outputs the discrete value V(t) represented by expression (6) or (7).

Alternatively, the amplitude calculation section 19a may output the discrete value V(t) represented by expression (6) or (7) when, for example, at least s number of sampling points of the amplitude signal m(t) exceed the threshold value $2V_k$ within the predetermined time period Δ(t). s is an arbitrary natural number. When s=2, $V_k$ is output as the discrete value V(t) in the example of FIG. 5. Owing to such a system, even when the level of the amplitude signal m(t) drastically changes within a very short time period, a discrete value V(t) which is not influenced by such a change is output from the amplitude calculation section 19a. Therefore, the power consumption of the transmission circuit 1 can be further reduced.

(Second Comparison Method)

Figure 6:
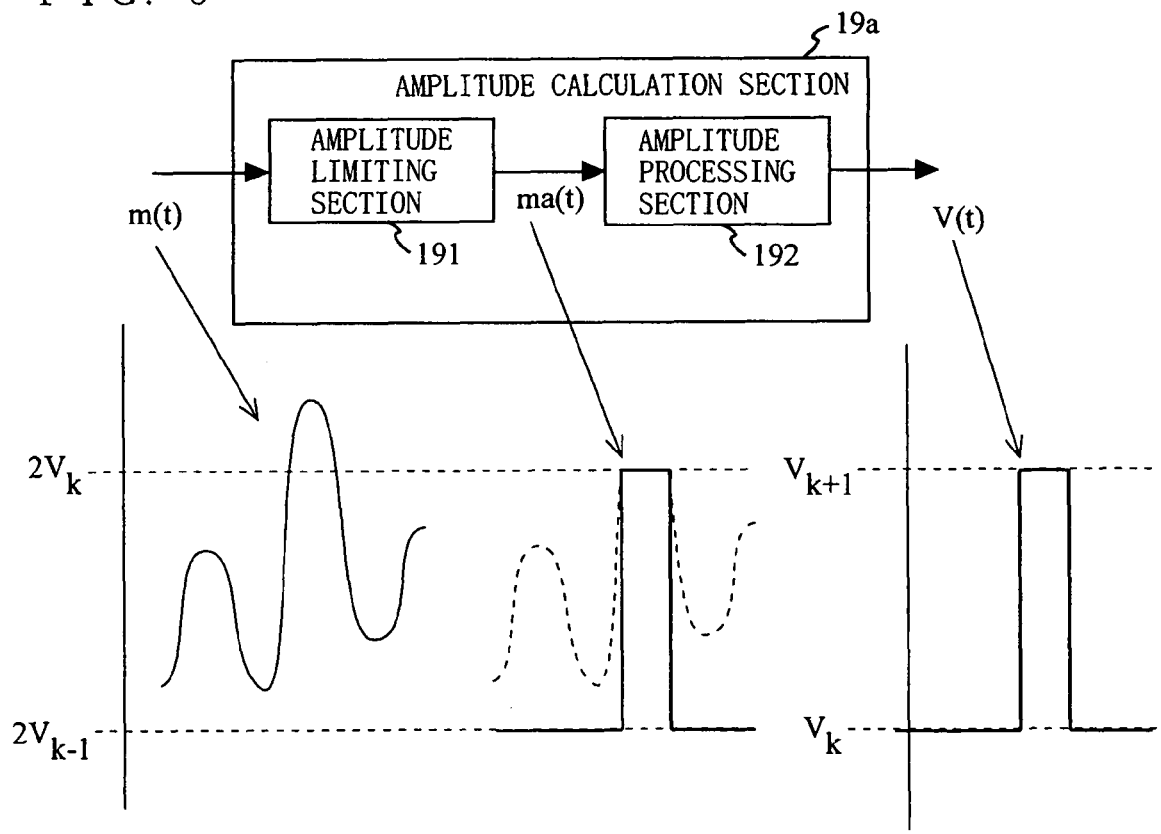
FIG. 6 shows an example of a second comparison method used by the amplitude calculation section 19*a*.

A second comparison method is performed as follows. The amplitude calculation section 19a outputs the discrete value V(t) represented by expression (6) or (7) simply when the level of the amplitude signal m(t) exceeds the threshold value $2V_k$. FIG. 6 shows an example of the second comparison method used by the amplitude calculation section 19a. In this example, it is assumed that the amplitude calculation section 19a includes an amplitude limiting section 191 and an amplitude processing section 192. When the level of the amplitude signal m(t) exceeds the threshold value $2V_k$, the amplitude limiting section 191 outputs an amplitude signal ma(t) having the level limited to $2V_k$. When the level of the amplitude signal m(t) is equal to the threshold value $2V_k$, the amplitude processing section 192 outputs the discrete value V(t) represented by expression (6) or (7). Owing to such a system, even when the level of the amplitude m(t) drastically changes, a discrete value V(t) which is not influenced by such a change is output from the amplitude calculation section 19a. Therefore, the power consumption of the transmission circuit 1 can be further reduced.

Figure 7A:
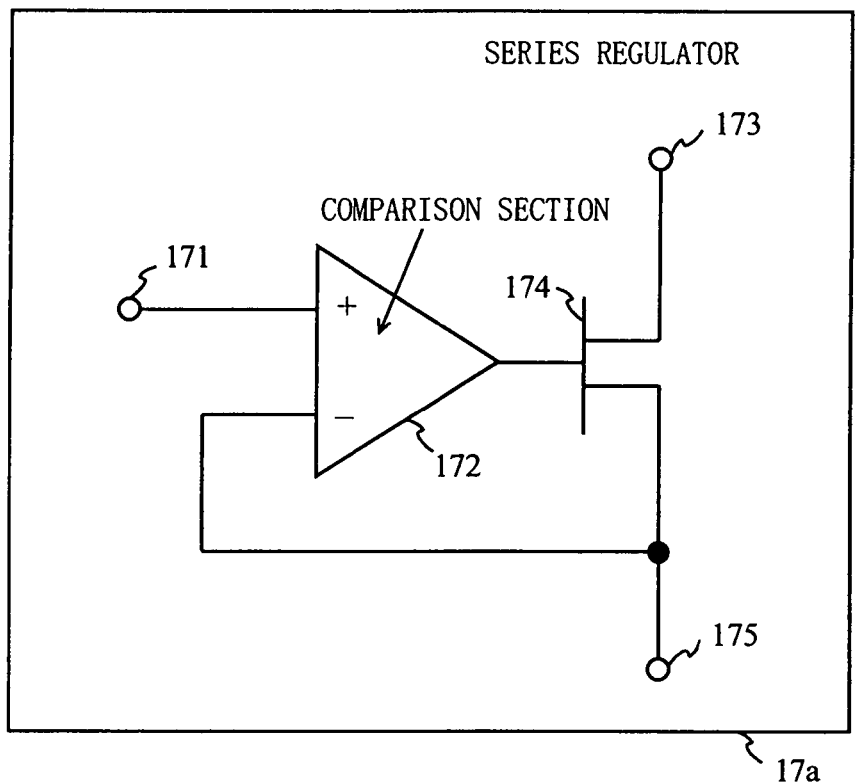
FIG. 7A is a block diagram showing an exemplary structure of a series regulator 17*a*.

Next, the amplitude amplification section 17, the amplitude modulation sections 15 and 16, and the combining section 18 will be described in detail. The amplitude amplification section 17 can be formed of, for example, a voltage-driven type series regulator. FIG. 7A is a block diagram showing an exemplary structure of a series regulator 17a. As shown in FIG. 17A, the series regulator 17a includes an input terminal 171, a comparison section 172, a power supply terminal 173, a transistor 174, and an output terminal 175. In this example, the transistor 174 is a field effect transistor. A discrete value Vb(t) is input to the input terminal 171 from the calculation section 21. The discrete value Vb(t) is input to a gate terminal of the transistor 174 via the comparison section 172. A drain terminal of the transistor 174 is supplied with a DC voltage from the power supply terminal 173. The transistor 174 outputs a voltage in proportion to the input discrete value Vb(t) from a source terminal thereof. The voltage which is output from the source terminal of the transistor 174 is fed back to the comparison section 172. Based on the fed-back voltage, the comparison section 172 adjusts the level of the discrete value Vb(t), which is to be input to the gate terminal of the transistor 174. Thus, the series regulator 17a can stably supply a voltage controlled in accordance with the level of the discrete value Vb(t) from the output terminal 175. The transistor 174 may be a bipolar transistor.

Figure 7B:
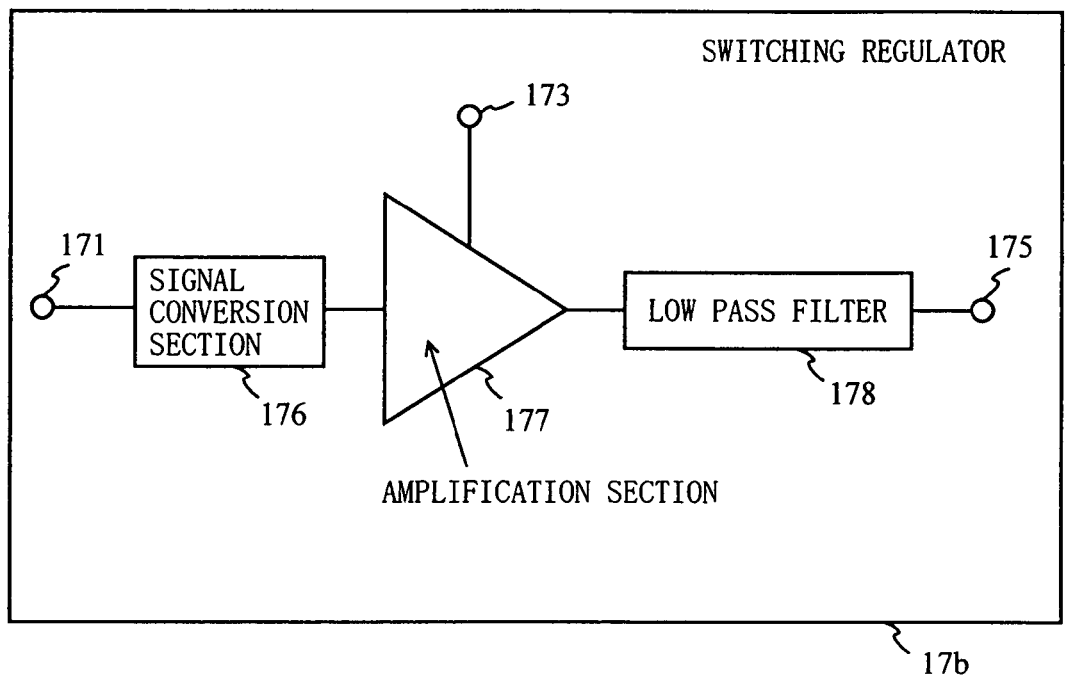
FIG. 7B is a block diagram showing an exemplary structure of a switching regulator 17*b*.

The amplitude amplification section 17 may be formed of, for example, a voltage-driven type switching regulator. FIG. 7B is a block diagram showing an exemplary structure of a switching regulator 17b. As shown in FIG. 7B, the switching regulator 17b includes an input terminal 171, a power supply terminal 173, a signal conversion section 176, an amplification section 177, a low pass filter 178, and an output terminal 175. A discrete value Vb(t) is input to the input terminal 171 from the calculation section 21. The discrete value Vb(t) is input to the signal conversion section 176. The signal conversion section 176 converts the input discrete value Vb(t) into a pulse-width-modulated or delta-sigma-modulated signal. The signal converted by the signal conversion section 176 is input to the amplification section 177. The amplification section 177 amplifies and outputs the input signal. The amplification section 177 is supplied with a DC voltage from the power supply terminal 173. As the amplification section 177, a high efficiency switching amplifier such as a class-D amplifier or the like is used.

The signal which is output from the amplification section 177 is input to the low pass filter 178. The low pass filter 178 removes spurious components including quantization noise and switching noise from the signal which is output from the amplification section 177. The signal deprived of the spurious components by the low pass filter 178 is output from the output terminal 175 as a voltage controlled in accordance with the level of the discrete value Vb(t). In order to stabilize the voltage to be output, the switching regulator 17b may feed the signal which is output from the low pass filter 178 back to the signal conversion section 176. The transmission circuit 1 can reduce the power consumption thereof by using the switching regulator 17b, which is operable at a high efficiency, for the amplitude amplification section 17.

Figure 7C:
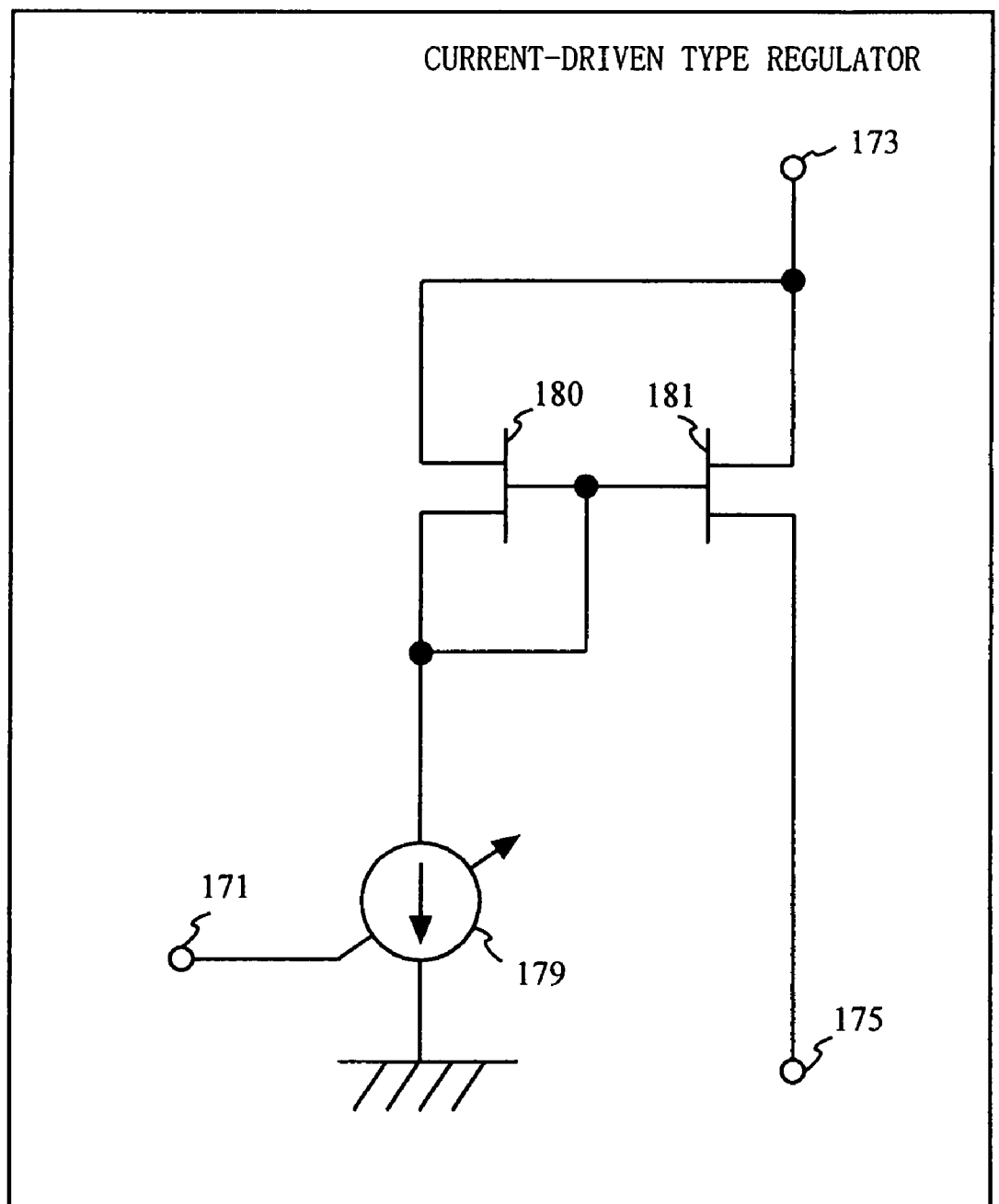
FIG. 7C is a block diagram showing an exemplary structure of a current-driven type regulator 17*c*.

The amplitude amplification section 17 may be formed of, for example, a current-drive type regulator. FIG. 7C is a block diagram showing an exemplary structure of a current-driven type regulator 17c. As shown in FIG. 7C, the current-driven type regulator 17c includes an input terminal 171, a power supply terminal 173, a variable current source 179, a transistor 180, a transistor 181, and an output terminal 175. A discrete value Vb(t) is input to the input terminal 171 from the calculation section 21. The power supply terminal 173 is supplied with a DC voltage. The discrete value Vb(t) which is input via the input terminal 171 is output from the output terminal 175 via the variable current source 179, the transistor 180 and the transistor 181, as a current controlled in accordance with the level of the discrete value Vb(t). The current-driven type regulator 17c having such a structure is useful when the amplitude modulation sections 15 and 16 are formed of a bipolar transistor. The transistors 180 and 181 may be a field effect transistor or a bipolar transistor.

Figure 8:
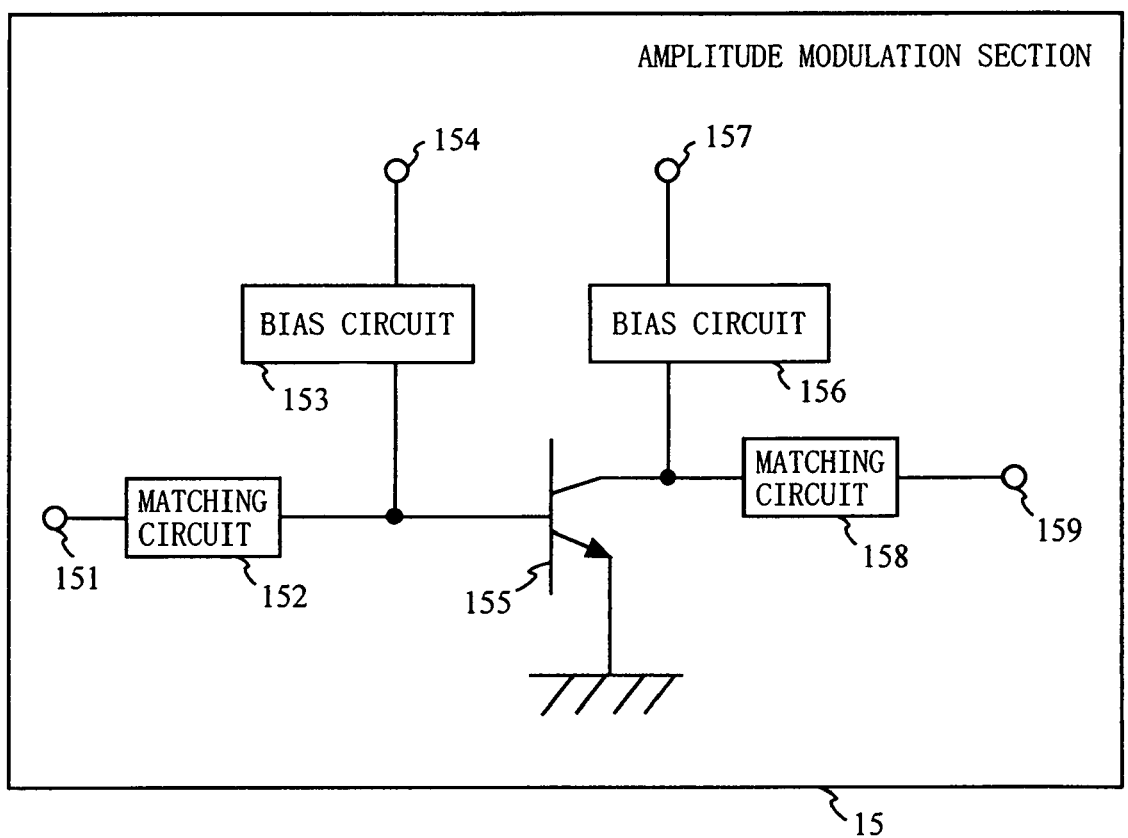
FIG. 8 is a block diagram showing an exemplary structure of an amplitude modulation section 15.

FIG. 8 is a block diagram showing an exemplary structure of the amplitude modulation section 15. As shown in FIG. 8, the amplitude modulation section 15 includes an input terminal 151, a matching circuit 152, a bias circuit 153, a power supply terminal 154, a transistor 155, a bias circuit 156, an input terminal 157, a matching circuit 158, and an output terminal 159. In this example, the transistor 155 is a bipolar transistor. A first angle-modulated signal is input to the input terminal 151 from the angular modulation section 13. The first angle-modulated signal is input to a base terminal of the transistor 155 via the matching circuit 152.

The power supply terminal 154 is supplied with a DC voltage. Namely, the base terminal of the transistor 155 is supplied with a bias voltage via the bias circuit 153. To the input terminal 157, a signal controlled in accordance with the level of the discrete value Vb(t) is input from the amplitude amplification section 17. The signal controlled in accordance with the level of the discrete value Vb(t) is input to a collector terminal of the transistor 155 via the bias circuit 156. The transistor 155 performs amplitude modulation on the first angle-modulated signal with the signal controlled in accordance with the level of the discrete value Vb(t), and outputs the resultant signal as an angle-modulated and amplitude-modulated signal. The modulated signal which is output from the transistor 155 is output from the output terminal 159 via the matching circuit 158. The transistor 155 may be a field effect transistor. The amplitude modulation section 16 has the same structure as that of the amplitude modulation section 15 and the description thereof will be omitted.

The combining section 18 is formed of, for example, a Wilkinson combiner, a 3 dB directional hybrid combiner, a Chireix combiner or the like.

As described above, in the transmission circuit 1 according to the first embodiment of the present invention, the amplitude calculation section 19a compares an amplitude signal m(t) and a plurality of threshold values $2V_n$ at an interval of a predetermined time period, and outputs a value having a level discretely changing in accordance with the level of the amplitude signal m(t) as a discrete value V(t). Therefore, the transmission circuit 1 can combine a first modulated signal and a second modulated signal each having a level discretely changing in accordance with the level of the amplitude signal m(t), and can output the combined signal as a transmission signal. Thus, the transmission circuit 1 can operate at a high efficiency while being compact in size, and output a highly linear transmission signal regardless of the level of the output power.

The transmission circuit 1 does not branch the signal output from the amplitude modulation section 15 or 16 into a plurality of components. Therefore, the transmission circuit 1 can suppress the loss caused by the branching of the signal and thus can reduce the power consumption of the transmission circuit 1.

Second Embodiment

Figure 9:
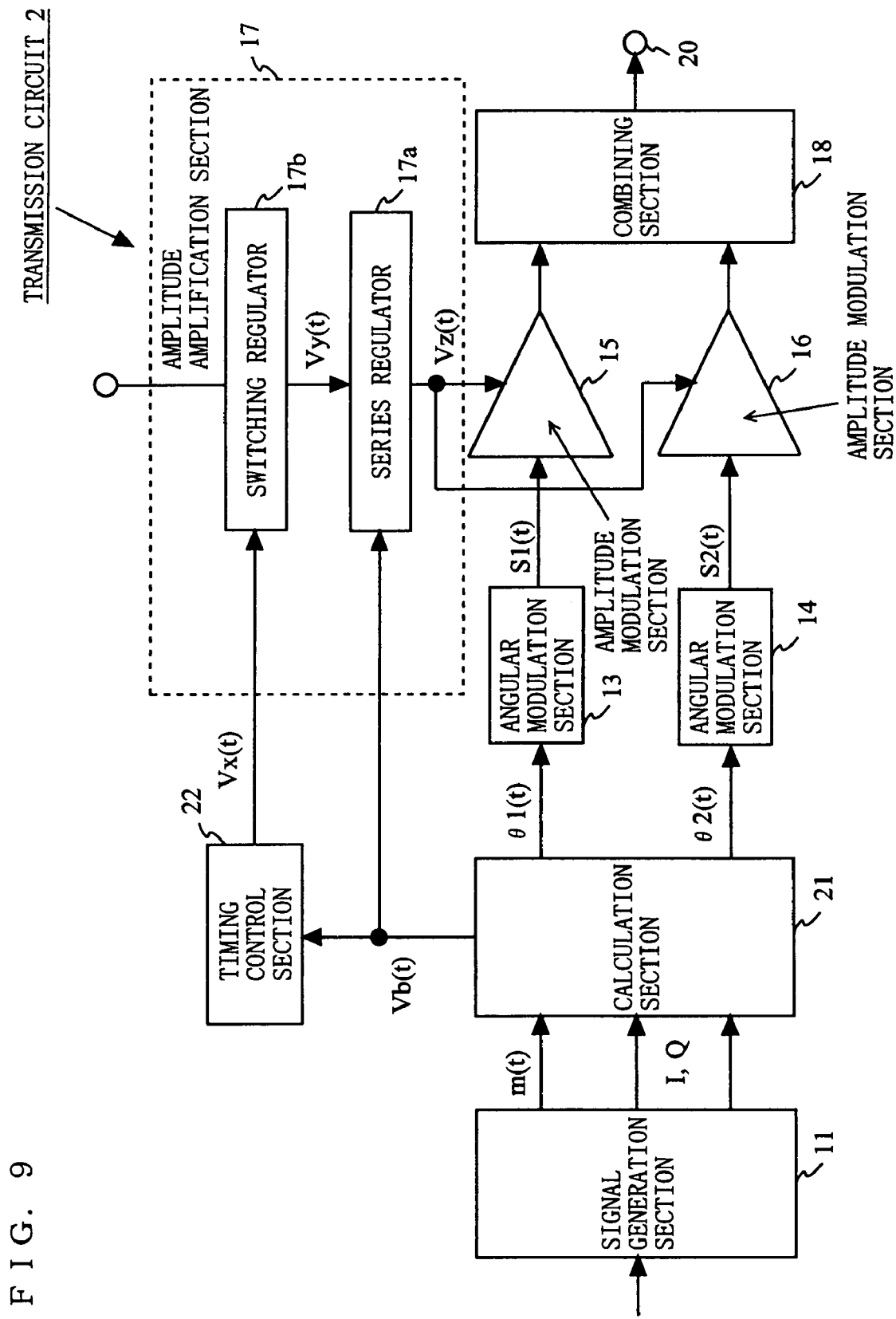
FIG. 9 is a block diagram showing an exemplary structure of a transmission circuit 2 according to a second embodiment of the present invention.

FIG. 9 is a block diagram showing an exemplary structure of a transmission circuit 2 according to a second embodiment of the present invention. As shown in FIG. 9, the transmission circuit 2 includes a timing control section 22 in addition to the elements included in the transmission circuit 1 according to the first embodiment. The amplitude amplification section 17 includes a series regulator 17a and a switching regulator 17b. The switching regulator 17b supplies a voltage to the series regulator 17a. The series regulator 17a supplies a voltage to the amplitude modulation sections 15 and 16. The series regulator 17a and the switching regulator 17b have the same structures as those shown in FIG. 7A and FIG. 7B.

FIG. 10 shows an exemplary timing diagram of the signals handled by the transmission circuit 2. With reference to FIG. 10, the transmission circuit 2 according to the second embodiment will be described. To the calculation section 21, an amplitude signal m(t) is input from the signal generation section 11 (see FIG. 10, (a)). The calculation section 21 outputs a discrete value Vb(t) using substantially the same method as in the first embodiment (see FIG. 10, (b)). The discrete value Vb(t) is input to the timing control section 22 and the series regulator 17a. In order to compensate for the rise of the switching regulator 17b, the timing control section 22 advances the timing for outputting the discrete value Vb(t) by Δtx, and outputs such a discrete value as a discrete value Vx(t) (see FIG. 10, (c)).

Instead of the timing control section 22 advancing the timing for outputting the discrete value Vb(t) by Δtx, the calculation section 21 may delay the timing for inputting the discrete value Vb(t) to the series regulator 17a, the timing for inputting the first phase signal θ1(t) to the angular modulation section 13, and the timing for inputting the second phase signal θ2(t) to the angular modulation section 14, by Δtx.

The discrete value Vx(t) is input to the switching regulator 17b. The switching regulator 17b outputs a voltage Vy(t) controlled by the discrete value Vx(t) (see FIG. 10, (d)). The voltage Vy(t) which is output from the switching regulator 17b is supplied to the series regulator 17a. Based on the supplied voltage Vy(t), the series regulator 17a outputs a voltage Vz(t) controlled in accordance with the level of the discrete value V(t) (see FIG. 10, (e)). The voltage Vz(t) which is output from the series regulator 17a is supplied to the amplitude modulation sections 15 and 16.

As described above, in the transmission circuit 2 according to the second embodiment of the present invention, the switching regulator 17b capable of operating at a high efficiency and the series regulator 17a capable of operating at a high speed are combined to form the amplitude amplification section 17, and thus the voltage to be supplied to the amplitude modulation sections 15 and 16 is controlled. Therefore, the transmission circuit 2 can operate at a higher efficiency and a higher speed than the transmission circuit 1 according to the first embodiment.

Third Embodiment

FIG. 11 is a block diagram showing an exemplary structure of a transmission circuit 3 according to a third embodiment of the present invention. As shown in FIG. 11, the transmission circuit 3 includes a variable gain amplification section 23 and a variable gain amplification section 24 instead of the amplitude amplification section 17 included in the transmission circuit 1 according to the first embodiment. To the variable gain amplification sections 23 and 24, a discrete value Vb(t) is input from the calculation section 21. The variable gain amplification section 23 amplifies the first angle-modulated signal S1(t) with a gain in accordance with the level of the discrete value Vb(t). The variable gain amplification section 24 amplifies the second angle-modulated signal S2(t) with a gain in accordance with the level of the discrete value Vb(t). The amplified first angle-modulated signal S1(t) and second angle-modulated signal S2(t) are respectively input to the amplitude modulation sections 15 and 16. Therefore, the transmission circuit 3 can combine the first modulated signal and the second modulated signal both having a level discretely changing in accordance with the level of the amplitude signal m(t), and can output the combined signal as a transmission signal. Thus, the transmission circuit 3 according to the third embodiment can operate at a high efficiency while being compact in size, and output a highly linear transmission signal regardless of the level of the output power, like in the first embodiment.

Figure 12:
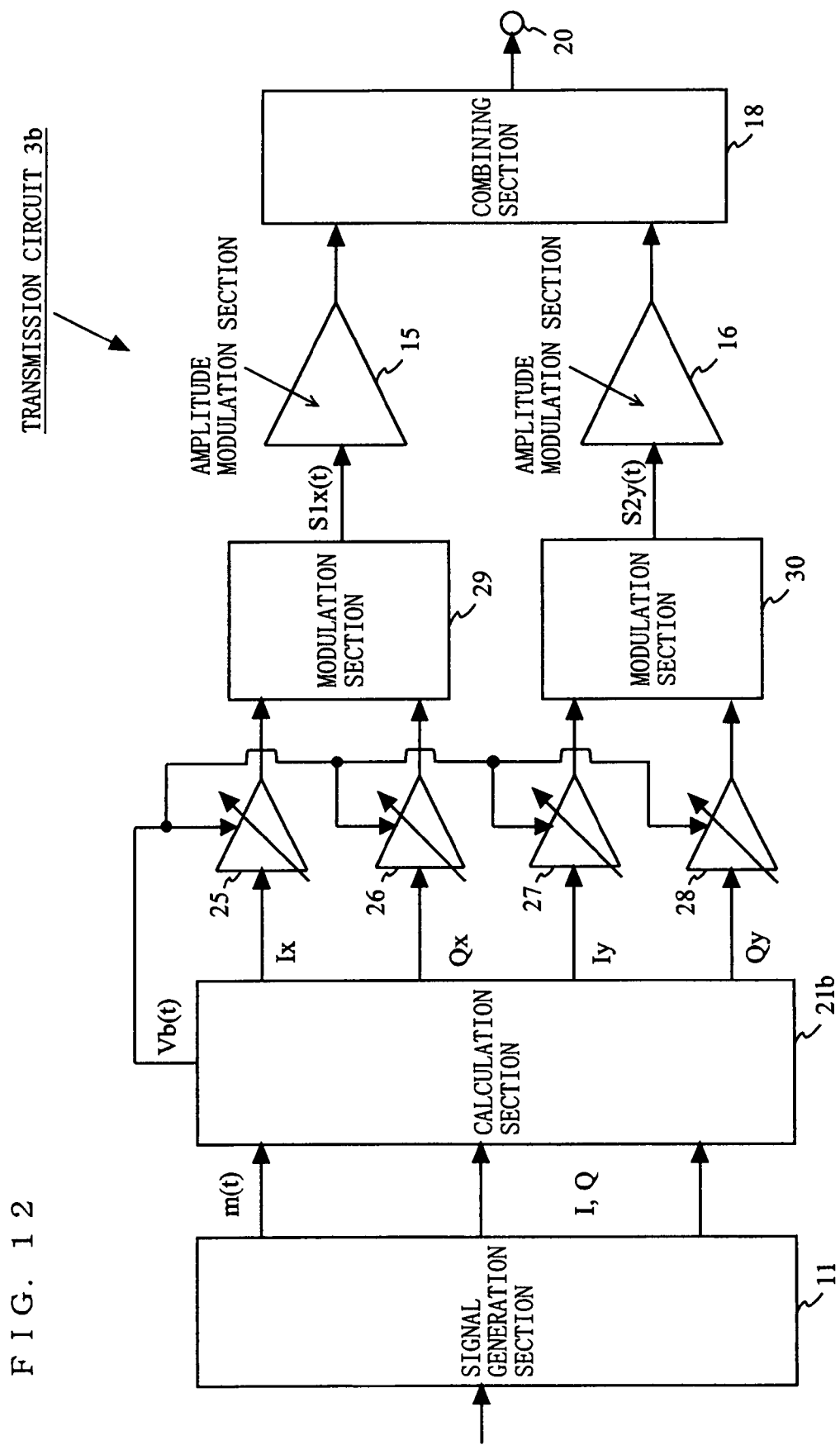
FIG. 12 is a block diagram showing an exemplary structure of a transmission circuit 3*b* according to the third embodiment of the present invention.

The transmission circuit according to the third embodiment may have a different structure from that described above. FIG. 12 is a block diagram showing an exemplary structure of a transmission circuit 3b according to the third embodiment of the present invention. As shown in FIG. 12, the transmission circuit 3b includes a signal generation section 11, a calculation section 21b, variable gain amplification sections 25 through 28, a modulation section 29, a modulation section 30, an amplitude modulation section 15, an amplitude modulation section 16, a combining section 18, and an output terminal 20. Identical elements to those in the first embodiment will bear identical reference numerals thereto and detailed descriptions thereof will be omitted.

The calculation section 21b outputs a discrete value Vb(t) in substantially the same manner as in the first embodiment. The calculation section 21b also outputs Ix, Qx, Iy and Qy signals by predetermined processing to the variable gain amplification sections 25 through 28, respectively. The variable gain amplification sections 25 and 26 respectively amplify the Ix and Qx signals with a gain in accordance with the level of the discrete value Vb(t). The variable gain amplification sections 27 and 28 respectively amplify the Iy and Qy signals with a gain in accordance with the level of the discrete value Vb(t). The amplified 1x and Qx signals are input to the modulation section 29, and the amplified Iy and Qy signals are input to the modulation section 30.

The modulation section 29 modulates the amplified 1× and Qx signals, and outputs the resultant signal as a first angle-modulated signal S1x(t). The modulation section 29 modulates the amplified Iy and Qy signals, and outputs the resultant signal as a second angle-modulated signal S2x(t). The first angle-modulated signal S1x(t) and the second angle-modulated signal S2x(t) are represented by expressions (18), (19) and (20).

$$S1x(t) = A\exp[j\{\arg(Ix(t) + jQx(t))\}] \quad \text{expression (18)}$$
$$= A\exp[j\{\arg(I(t) + jQ(t))\} - \phi(t)]$$

$$S2y(t) = A\exp[j\{\arg(Iy(t) + jQy(t))\}] \quad \text{expression (19)}$$
$$= A\exp[j\{\arg(I(t) + jQ(t))\} - \phi(t)]$$

$$\phi(t) = \cos^{-1}\left[\frac{m(t)}{2V(t)}\right] \quad \text{expression (20)}$$

The first angle-modulated signal S1x(t) and the second angle-modulated signal S2x(t) are respectively input to the amplitude modulation sections 15 and 16. Therefore, the transmission circuit 3b can combine the first modulated signal and the second modulated signal both having a level discretely changing in accordance with the level of the amplitude signal m(t), and can output the combined signal as a transmission signal. Thus, the transmission circuit 3b according to the third embodiment can operate at a high efficiency while being compact in size, and output a highly linear transmission signal regardless of the level of the output power, like in the first embodiment.

Figure 13:
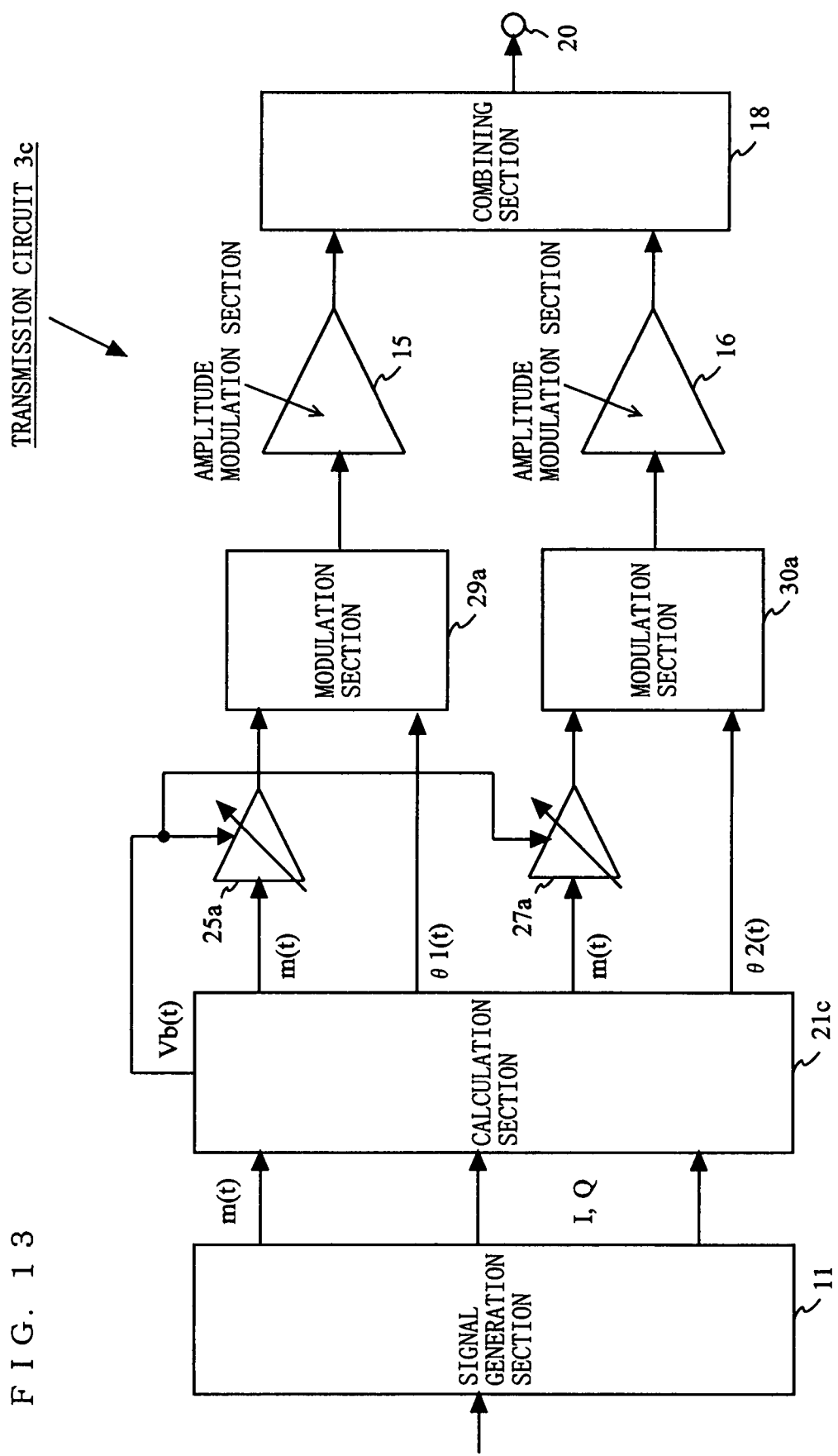
FIG. 13 is a block diagram showing an exemplary structure of a transmission circuit 3*c* according to the third embodiment of the present invention.

The transmission circuit according to the third embodiment may have a different structure from that described above. FIG. 13 is a block diagram showing an exemplary structure of a transmission circuit 3c according to the third embodiment of the present invention. As shown in FIG. 13, the transmission circuit 3c includes a signal generation section 11, a calculation section 21c, a variable gain amplification section 25a, and a variable gain amplification section 27a, a modulation section 29a, a modulation section 30a, an amplitude modulation section 15, an amplitude modulation section 16, a combining section 18, and an output terminal 20. Identical elements to those in the first embodiment will bear identical reference numerals thereto and detailed descriptions thereof will be omitted.

The calculation section 21c outputs an amplitude signal m(t) in addition to the signals output by the calculation section 21 in the first embodiment. The amplitude signal m(t) is input to the variable gain amplification sections 25a and 27a. The variable gain amplification section 25a amplifies the amplitude signal m(t) with a gain in accordance with the level of the discrete value Vb(t). The variable gain amplification section 27a amplifies the amplitude signal m(t) with a gain in accordance with the level of the discrete value Vb(t). The modulation section 29a modulates the amplified amplitude signal m(t) and the first phase signal θ1(t), and thus generates a first modulated signal. The modulation section 30a modulates the amplified amplitude signal m(t) and the second phase signal θ2(t), and thus generates a second modulated signal.

Therefore, the transmission circuit 3c can combine the first modulated signal and the second modulated signal both having a level discretely changing in accordance with the level of the amplitude signal m(t), and can output the combined signal as a transmission signal. Thus, the transmission circuit 3c according to the third embodiment can operate at a high efficiency while being compact in size, and output a highly linear transmission signal regardless of the level of the output power, like in the first embodiment.

Figure 14:
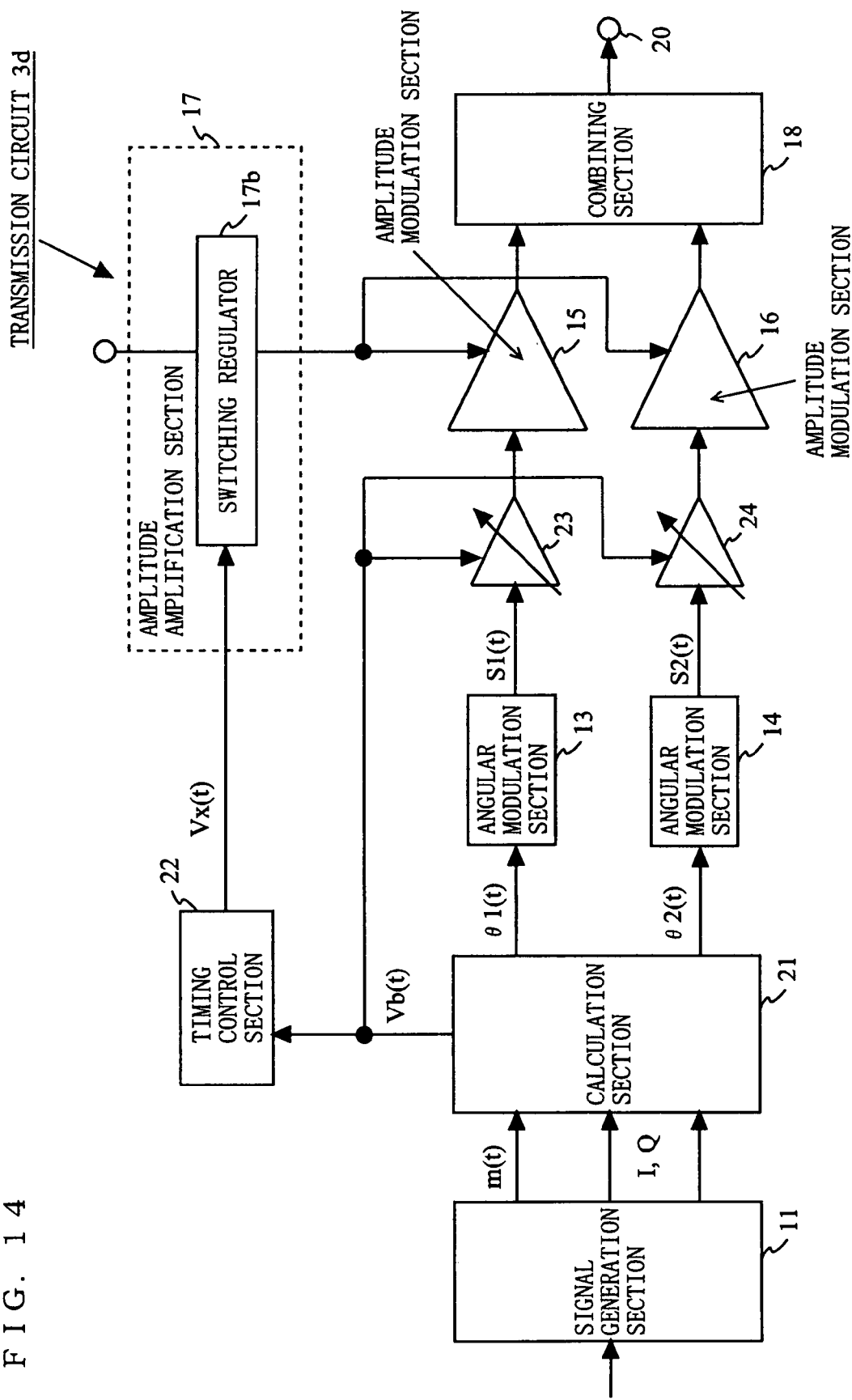
FIG. 14 is a block diagram showing an exemplary structure of a transmission circuit 3*d* according to the third embodiment of the present invention.

The transmission circuit according to the third embodiment may have a different structure from that described above. FIG. 14 is a block diagram showing an exemplary structure of a transmission circuit 3d according to the third embodiment of the present invention. As shown in FIG. 14, the transmission circuit 3d includes a timing control section 22 and a switching regulator 17b in addition to the elements included in the transmission circuit 3 shown in FIG. 11. The timing control section 22 outputs a discrete value V(t) in accordance with the above-described timing (see FIG. 10, (c)). The switching regulator 17b supplies a voltage Vy(t) controlled by the discrete value Vx(t) to the amplitude modulation sections 15 and 16 (see FIG. 10, (d)). Owing to such a system, the switching regulator 17b controls the voltage to be supplied to the amplitude modulation sections 15 and 16 at a high efficiency. Therefore, the transmission circuit 3d can operate at a higher efficiency than the transmission circuit 3 described above with reference to FIG. 11.

Fourth Embodiment

FIG. 15 is a block diagram showing an exemplary structure of a transmission circuit 4 according to a fourth embodiment of the present invention. As shown in FIG. 15, in the transmission circuit 4, transmission power information p(t) is input to a signal generation section 11a, unlike in the transmission circuit 1 according to the first embodiment. The transmission power information p(t) represents the level of the output power of a transmission signal from a base station. The signal generation section 11a outputs an amplitude signal mp(t) having a level changed such that the amplitude signal mp(t) has a positive characteristic with respect to the level of the output power represented by the transmission power information p(t). The amplitude signal mp(t) is typically represented by expression (21).

$$mp(t)=p(t)\times m(t) \quad \text{expression (21)}$$

The amplitude amplification section 19a outputs a discrete value Vp(t) from the amplitude signal mp(t) in substantially the same manner as described above. Except for this, the transmission circuit 4 operates in the same manner as the transmission circuit 1 according to the first embodiment. Thus, even when the level of the output power represented by the transmission power information p(t) is changed, the transmission circuit 4 can output a highly linear transmission signal at a high efficiency.

Figure 16:
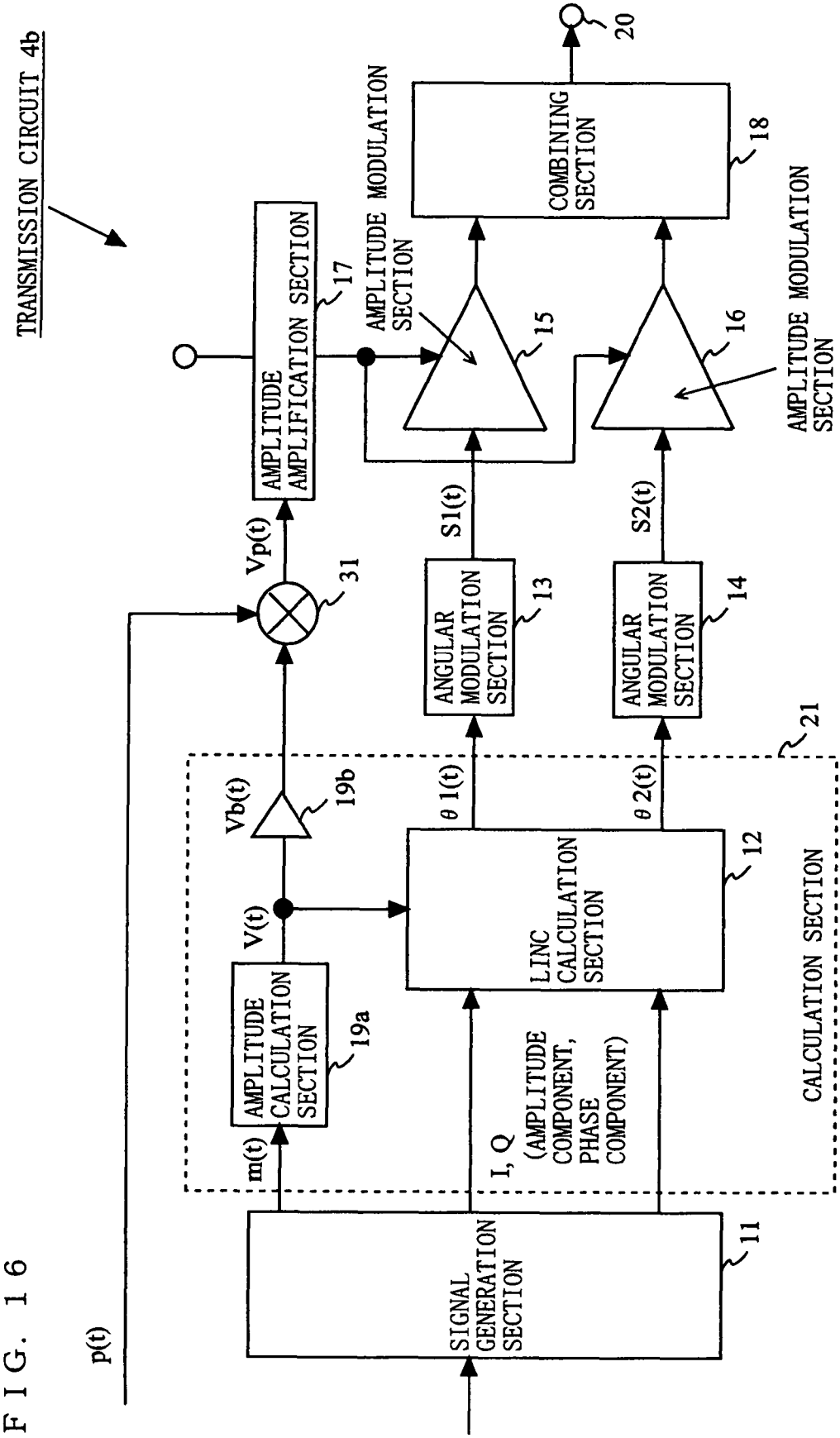
FIG. 16 is a block diagram showing an exemplary structure of a transmission circuit 4*b* according to the fourth embodiment of the present invention.

The transmission circuit according to the fourth embodiment may have a different structure from that described above. FIG. 16 is a block diagram showing an exemplary structure of a transmission circuit 4b according to the fourth embodiment of the present invention. As shown in FIG. 16, the transmission circuit 4b includes a multiplication section 31 in addition to the elements included in the transmission circuit 1 according to the first embodiment. To the multiplication section 31, transmission power information p(t) is input. The multiplication section 31 outputs a discrete value Vp(t) having a level changed such that the discrete value Vp(t) has a positive characteristic with respect to the level of the output power represented by the transmission power information p(t). The discrete variable Vp(t) is typically represented by expression (22). Thus, the transmission circuit 4b can provide substantially the same effects as those of the transmission circuit 4 shown in FIG. 15.

$$Vp(t)=p(t)\times Vb(t) \quad \text{expression (22)}$$

Figure 17:
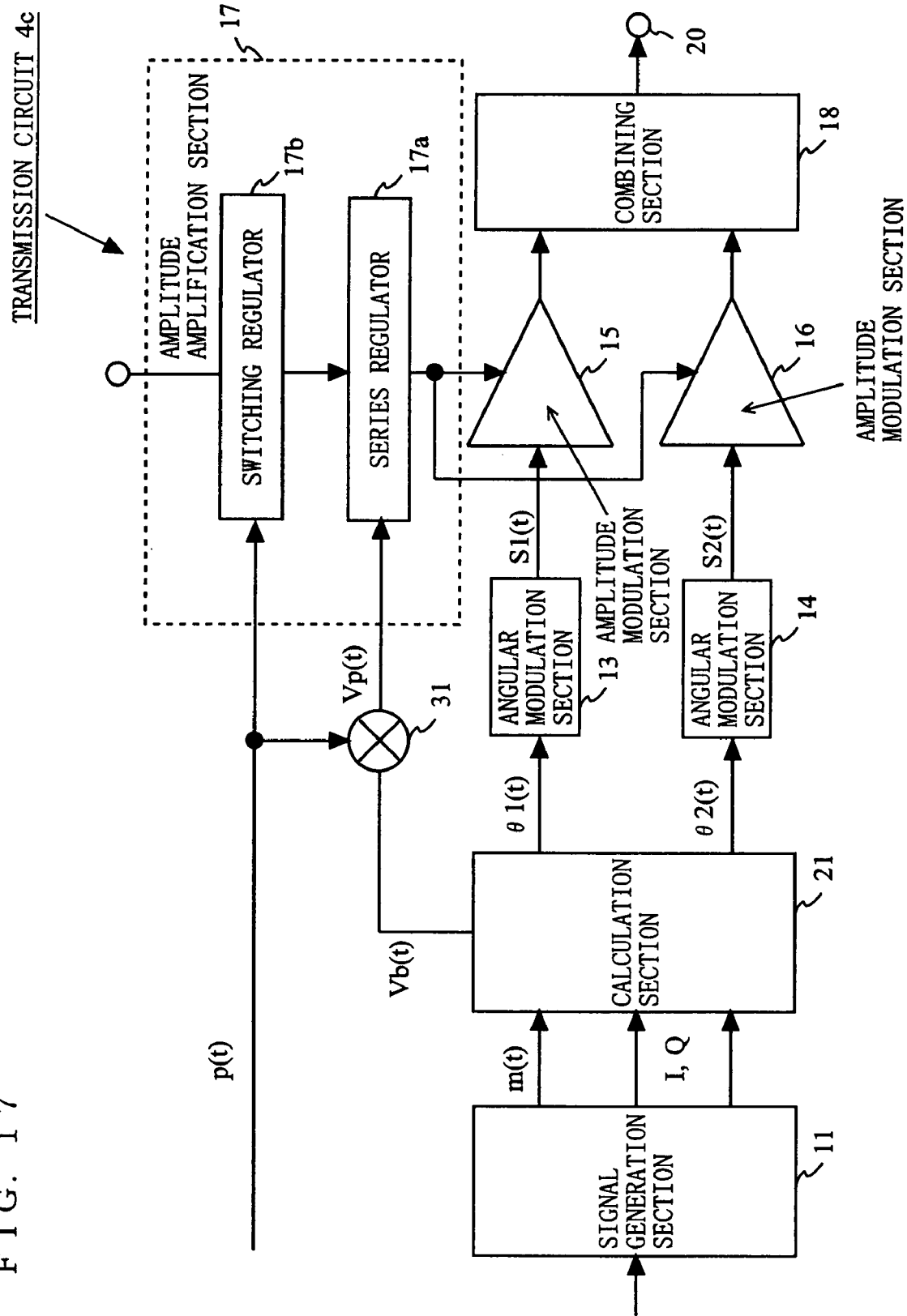
FIG. 17 is a block diagram showing an exemplary structure of a transmission circuit 4*c* according to the fourth embodiment of the present invention.

The transmission circuit according to the fourth embodiment may have a different structure from that described above. FIG. 17 is a block diagram showing an exemplary structure of a transmission circuit 4c according to the fourth embodiment of the present invention. As shown in FIG. 17, the transmission circuit 4c includes a signal generation section 11, a calculation section 21, an angular modulation section 13, an angular modulation section 14, an amplitude modulation section 15, an amplitude modulation section 16, an amplitude amplification section 17, a combining section, an amplitude calculation section 19a, a multiplication section 31, and an output terminal 20. The amplitude amplification section 17 includes a series regulator 17a and a switching regulator 17b.

Transmission power information p(t) is input to the switching regulator 17b and the multiplication section 31. The switching regulator 17b supplies a voltage controlled in accordance with the transmission power information p(t) to the series regulator 17a. The multiplication section 31 multiplies a discrete value V(t) by the transmission power information p(t), and thus supplies a discrete value Vp(t) to the series regulator 17a. Thus, even when the level of the output power represented by the transmission power information p(t) is changed, the transmission circuit 4c can output a highly linear transmission signal at a high efficiency.

Figure 18:
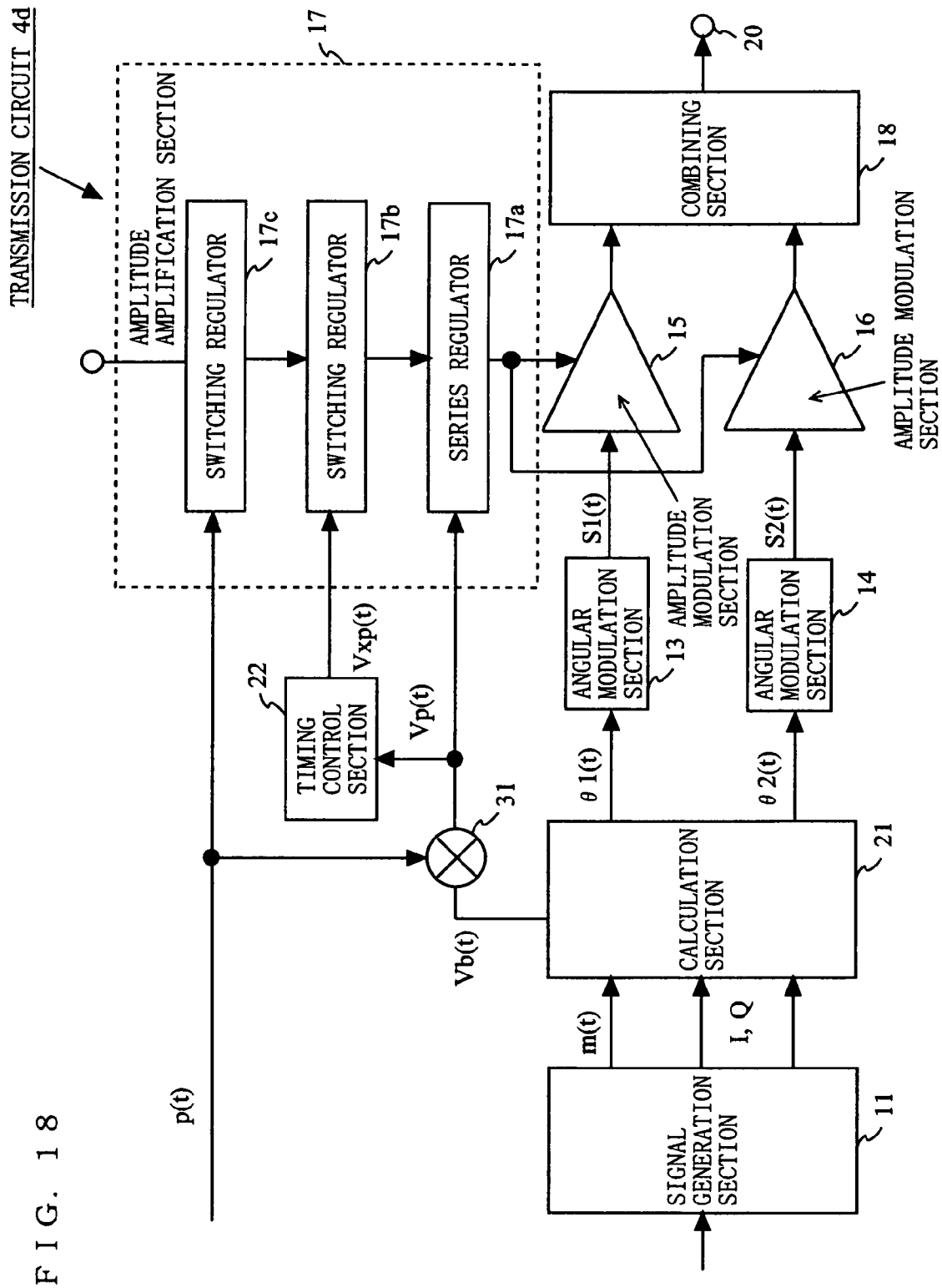
FIG. 18 is a block diagram showing an exemplary structure of a transmission circuit 4*d* according to the fourth embodiment of the present invention.

The transmission circuit according to the fourth embodiment may have a different structure from that described above. FIG. 18 is a block diagram showing an exemplary structure of a transmission circuit 4d according to the fourth embodiment of the present invention. As shown in FIG. 18, in the transmission circuit 4d, a switching regulator 17c supplies a voltage controlled in accordance with the transmission power information p(t) to the switching regulator 17b. The transmission circuit 4d having such a structure also can output a highly linear transmission signal at a high efficiency even when the level of the output power represented by the transmission power information p(t) is changed.

Figure 19A:
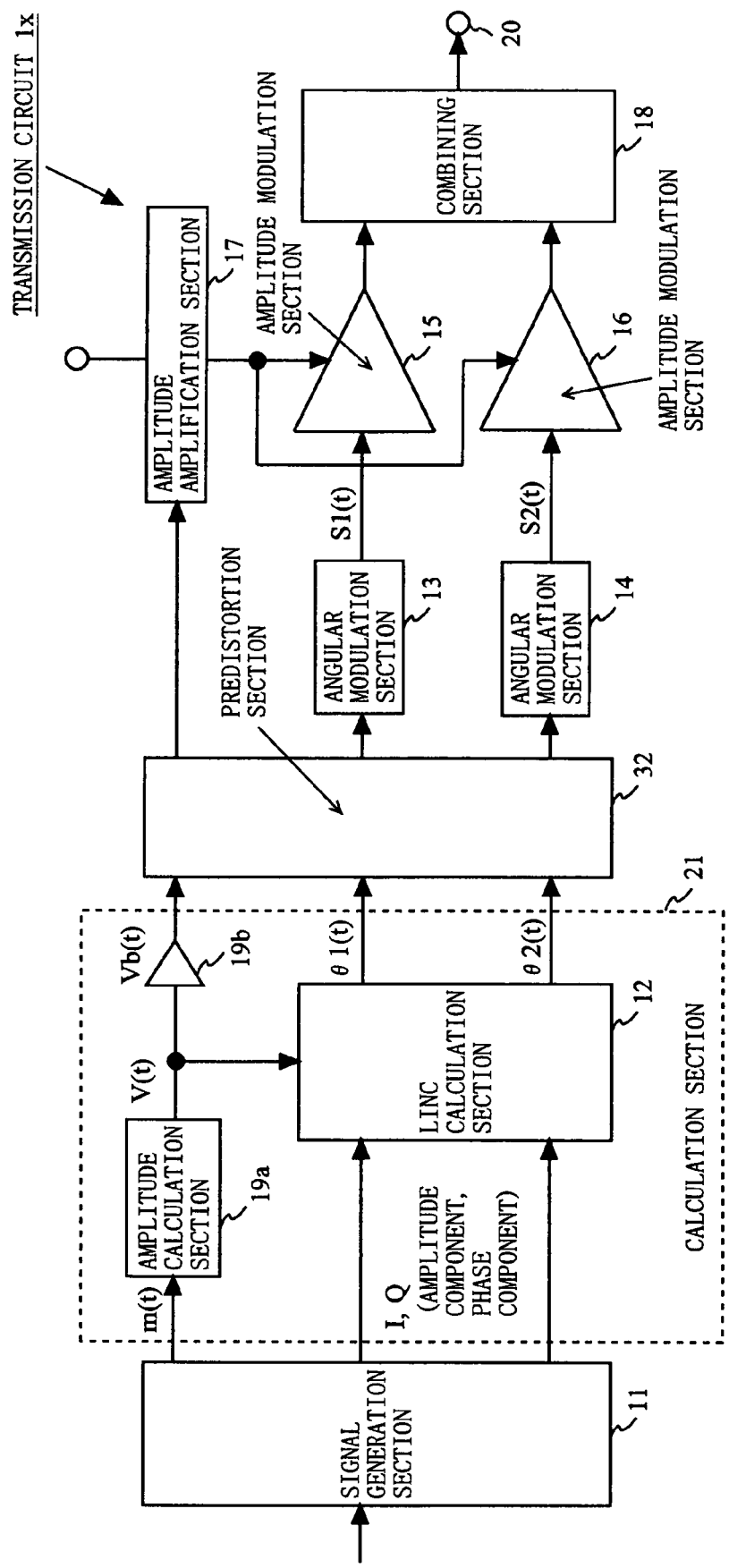
FIG. 19A is a block diagram showing an exemplary structure of a transmission circuit 1x according to the first embodiment including a predistortion section 32.

The transmission circuits 1 through 4 according to the first through fourth embodiments may further include, at an output of the calculation section 21, a predistortion section 32 for compensating for a distortion of at least one of the discrete value Vb(t), the first phase signal θ1(t) and the second phase signal θ2(t), in order to compensate for the nonlinearity of at least one of the angular modulation sections 13 and 14, the amplitude modulation sections 15 and 16, and the amplitude amplification section 17. FIG. 19A is a block diagram showing an exemplary structure of a transmission circuit 1x according to the first embodiment including the predistortion section 32. As shown in FIG. 19A, the predistortion section 32 compensates the discrete value V(t), the first phase signal θ1(t) and/or the second phase signal θ2(t) output from the calculation section 21, such that the distortion caused by at least one of the angular modulation sections 13 and 14, the amplitude amplification sections 15 and 16, and the amplitude amplification section 17 is suppressed. Thus, the transmission circuit 1x can output a transmission signal with less distortion than transmission circuits described above in the first through fourth embodiments.

Figure 19B:
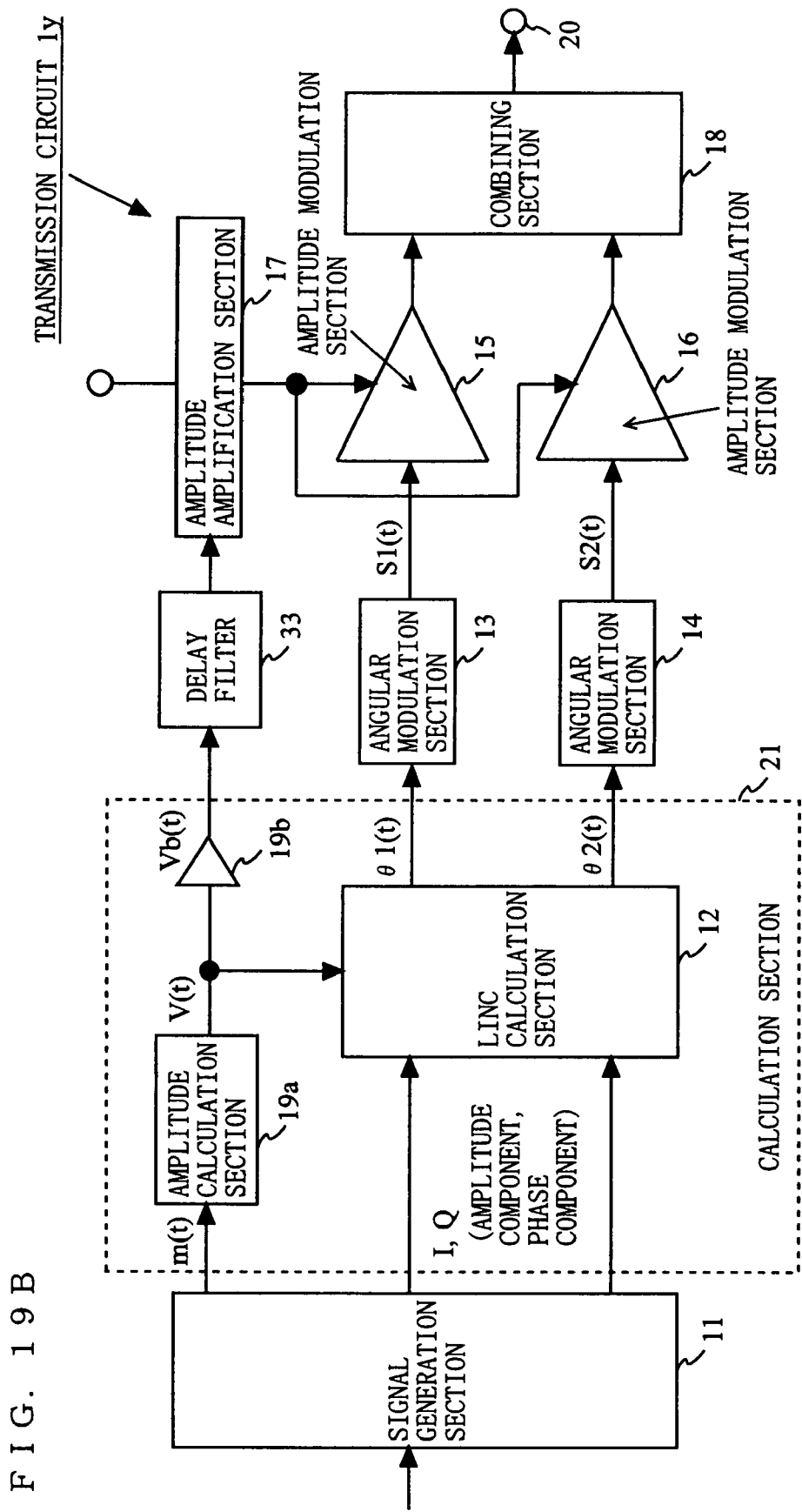
FIG. 19B is a block diagram showing an exemplary structure of a transmission circuit 1y according to the first embodiment including a delay filter 33.

Alternatively, the transmission circuits 1 through 4 according to the first through fourth embodiments may further include a delay filter 33 as in a transmission circuit 1y shown in FIG. 19B, in order to eliminate the delay time between the amplitude component and the phase component included in the transmission signal. FIG. 19B is a block diagram showing an exemplary structure of the transmission circuit 1y according to the first embodiment including the delay filter 33. As shown in FIG. 19B, the delay filter 33 adjusts a relative delay time between the amplitude component and the phase component included in the transmission signal. The delay filter 33 is formed of, for example, an FIR filter. Thus, the transmission circuit 1y can output a transmission signal with less distortion than transmission circuits described above in the first through fourth embodiments.

Figure 19C:
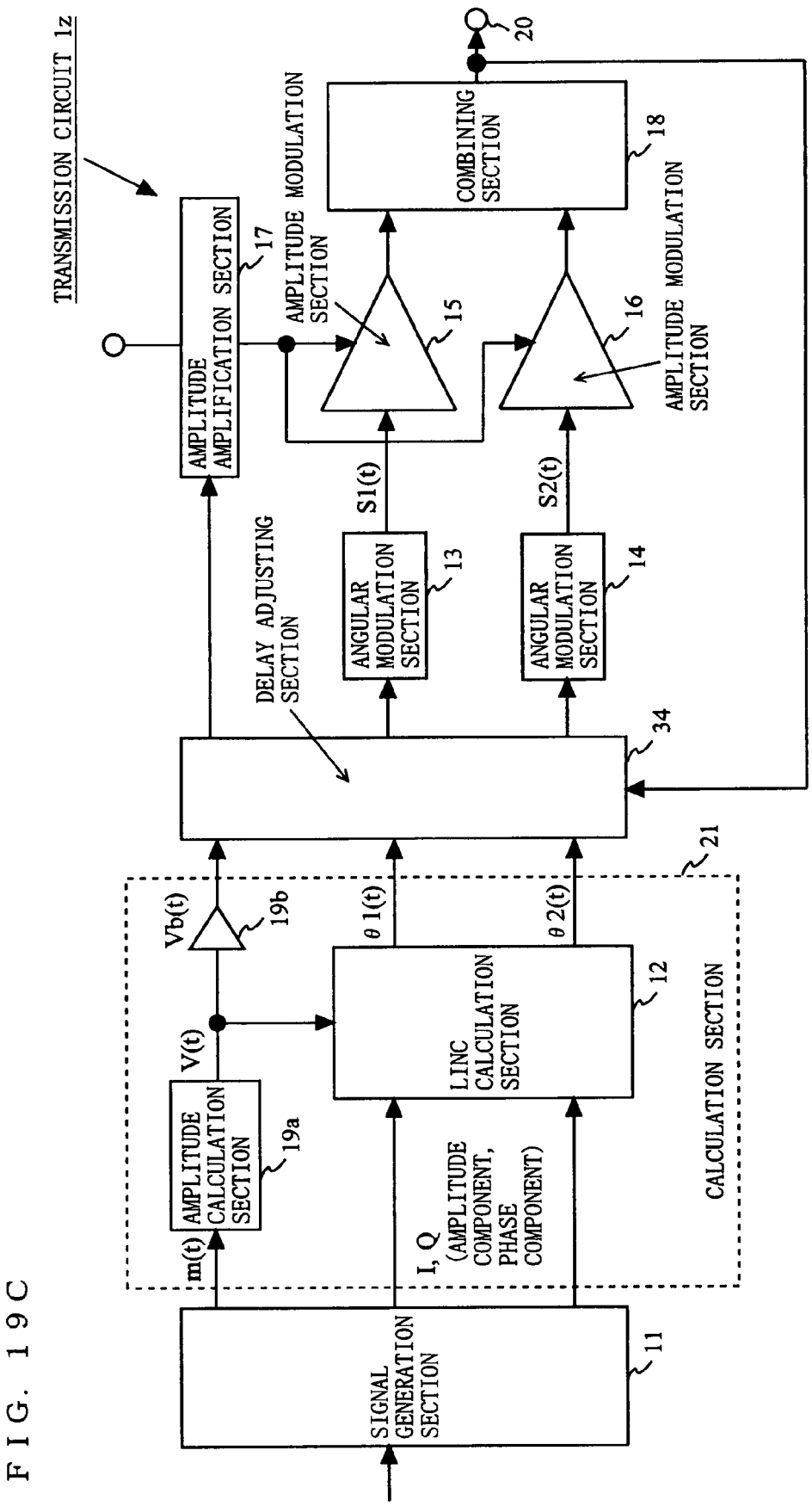
FIG. 19C is a block diagram showing an exemplary structure of a transmission circuit 1z according to the first embodiment including a delay adjusting section 34.

Still alternatively, the transmission circuits 1 through 4 according to the first through fourth embodiments may further include a delay adjusting section 34 as in a transmission circuit 1z shown in FIG. 19C, in order to eliminate the delay time between the amplitude component and the phase component included in the transmission signal. FIG. 19C is a block diagram showing an exemplary structure of the transmission circuit 1z according to the first embodiment including the delay adjusting section 34. As shown in FIG. 19C, the delay adjusting section 34 adjusts the delay time of at least one of the discrete value Vb(t), the first phase signal θ1($t$) and the second phase signal θ2($t$) based on the transmission signal combined by the combining section 18, in order to eliminate the delay time between the amplitude component and the phase component included in the transmission signal.

Fifth Embodiment

Figure 20:
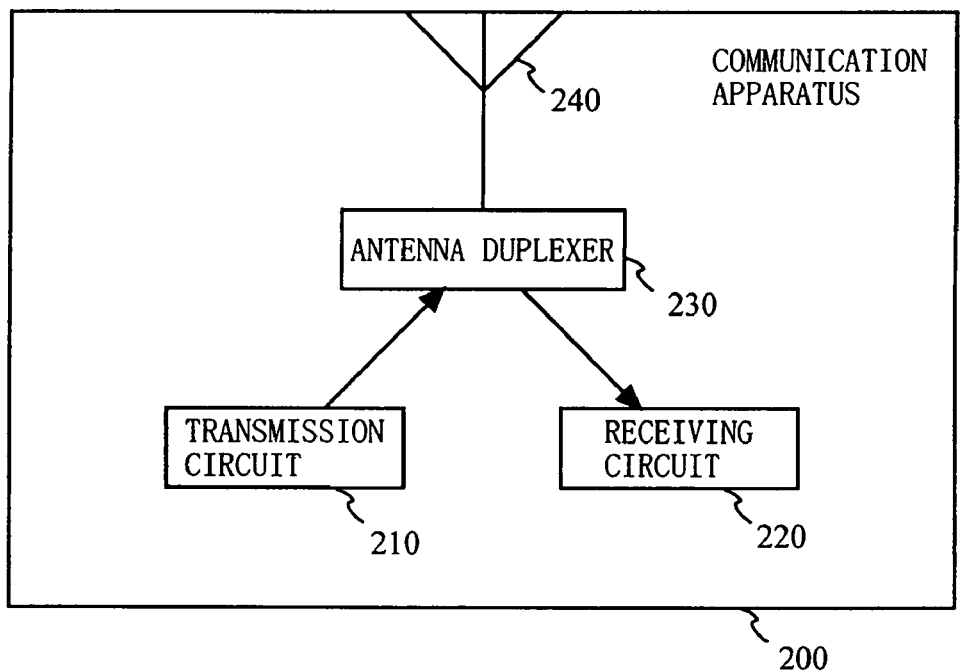
FIG. 20 is a block diagram showing an exemplary structure of a communication apparatus 200 according to a fifth embodiment of the present invention.
Figure 21:
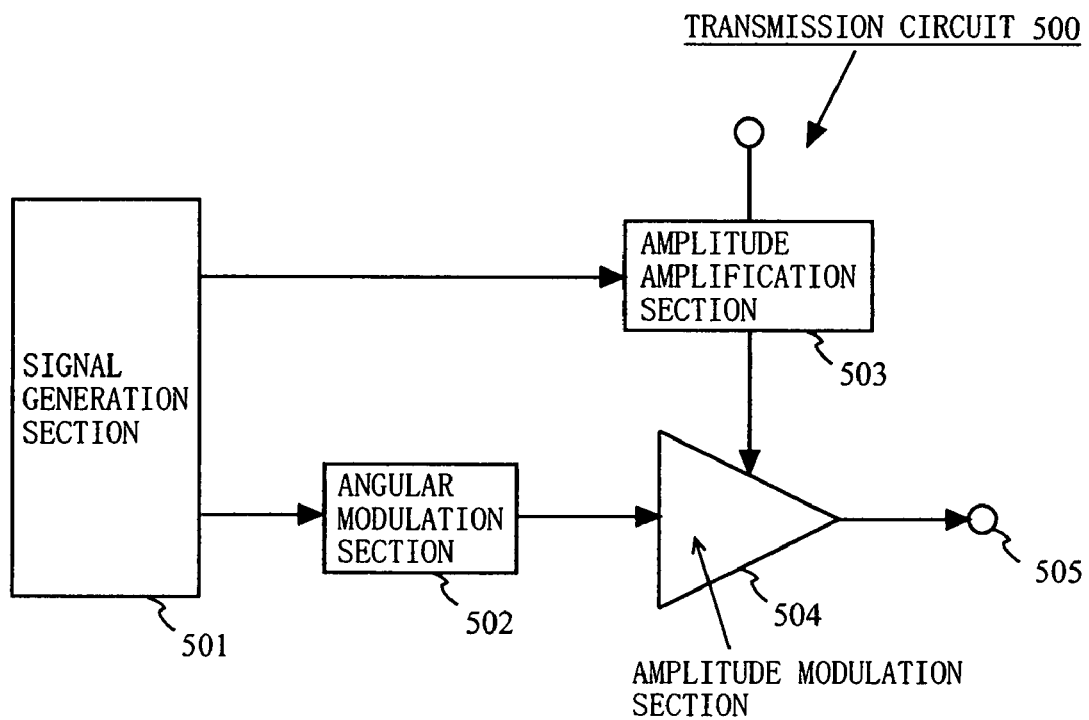
FIG. 21 is a block diagram showing a structure of a conventional transmission circuit 500.
Figure 22:
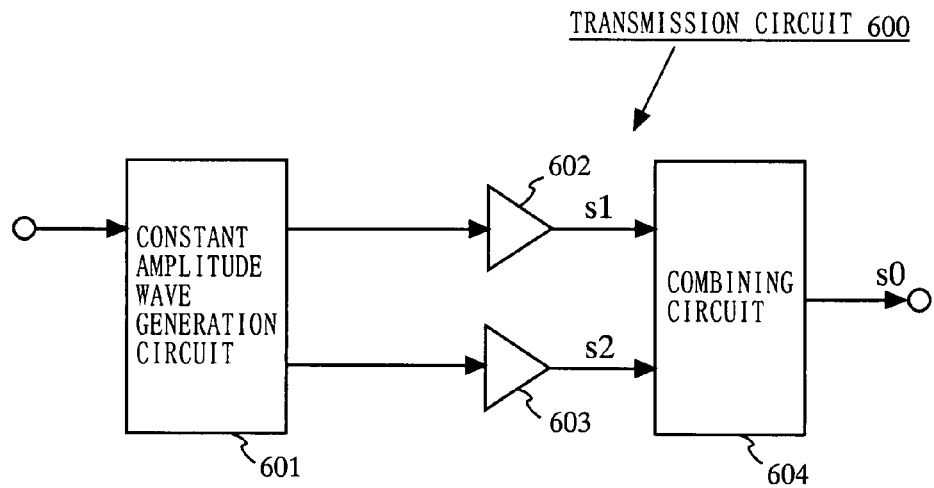
FIG. 22 is a block diagram showing a structure of a conventional transmission circuit 600.

FIG. 20 is a block diagram showing an exemplary structure of a communication apparatus according to a fifth embodiment of the present invention. As shown in FIG. 20, a communication apparatus 200 according to the fifth embodiment includes a transmission circuit 210, a receiving circuit 220, an antenna duplexer 230, and an antenna 240. The transmission circuit 210 is a transmission circuit according to one of the first through fourth embodiments. The antenna duplexer 230 sends a transmission signal which is output from the transmission circuit 210 to the antenna 240 while preventing the transmission signal from leaking to the receiving circuit 230. The antenna duplexer 230 also sends a receiving signal which is input from the antenna 240 to the receiving circuit 230 while preventing the receiving signal from leaking to the transmission circuit 210. Therefore, the transmission signal is output from the transmission circuit 210 and released to the outside from the antenna 240 via the antenna duplexer 230. The receiving signal is received by the antenna 240 and is received by the receiving circuit 220 via the antenna duplexer 230. The communication apparatus 200 according to the fifth embodiment uses a transmission circuit according to one of the first through fourth embodiments and thus can reduce the distortion of the wireless communication apparatus while guaranteeing the linearity of the transmission signal. In addition, since no branching element such as a directional coupler or the like is provided on the output side of the transmission circuit 210, the loss caused in the portion from the transmission circuit 210 to the antenna 240 can be reduced. Therefore, the communication apparatus 200 can reduce the power consumption at the time of transmission and can be used for a long period of time as a wireless communication apparatus. The communication apparatus 200 may include only the transmission circuit 210 and the antenna 240.

A transmission circuit according to the present invention is applicable to, for example, a communication apparatus such as a mobile phone, a wireless LAN device or the like.

While the invention has been described in detail, the foregoing description is in all aspects illustrative and not restrictive. It is understood that numerous other modifications and variations can be devised without departing from the scope of the invention.

What is claimed is:

1. A transmission circuit for generating a transmission signal based on input data and outputting the transmission signal, the transmission circuit comprising:
 a signal generation section for modulating the input data to generate an amplitude signal representing an amplitude component of the input data and data of a predetermined form;
 a calculation section for performing a calculation using the amplitude signal and the data of the predetermined form, and outputting a discrete value having a level which is discrete at an interval of a predetermined time period, a first phase signal and a second phase signal;
 a first angular modulation section for performing angular modulation on the first phase signal, and outputting the resultant signal as a first angle-modulated signal;
 a first amplitude modulation section for performing amplitude modulation on the first angle-modulated signal with a signal in accordance with the level of the discrete value, and outputting the resultant signal as a first modulated signal;
 a second angular modulation section for performing angular modulation on the second phase signal, and outputting the resultant signal as a second angle-modulated signal;
 a second amplitude modulation section for performing amplitude modulation on the second angle-modulated signal with a signal in accordance with the level of the discrete value, and outputting the resultant signal as a second modulated signal; and
 a combining section for combining the first modulated signal and the second modulated signal, and outputting the resultant signal as a transmission signal;
 wherein the calculation section
  compares the amplitude signal and a plurality of threshold values and outputs a discrete value having a level which is discrete at an interval of the predetermined time period; and
  calculates a phase component of the data of the predetermined form and outputs the first phase signal having the phase component shifted in one direction by a predetermined phase and the second phase signal having the phase component shifted in the other direction by the predetermined phase.

2. A transmission circuit according to claim 1, wherein the calculation section comprises:
 an amplitude calculation section for comparing n number of threshold values $2V_n$ having levels continuously increasing discretely and the amplitude signal at an interval of the predetermined time period, and when the amplitude signal has a level which is higher than one of two continuous threshold values, $2V_k$, and is equal to, or lower than, the other threshold value $2V_{k+1}$, outputting a discrete value $\alpha V_{k+1}$ obtained by multiplying the other threshold value $2V_{k+1}$ by a predetermine value α;
 a LINC calculation section for calculating a phase component of the data of the predetermined form, calculating the predetermined phase by inverse-cosining a quotient obtained by dividing the level of the amplitude signal by the other threshold value $2V_{k+1}$, and outputting the first phase signal having the phase component shifted in one direction by the predetermined phase and the second phase signal having the phase component shifted in the other direction by the predetermined phase; and
 an amplification section for outputting a discrete value $\alpha \cdot \beta V_{k+1}$ obtained by multiplying the discrete value $\alpha V_{k+1}$ which is output from the amplitude calculation section by a predetermined value β.

3. A transmission circuit according to claim 2, wherein when at least one of sampling points of the amplitude signal exceeds the one threshold value $2V_k$ within the predetermined time period, the amplitude calculation section outputs a discrete value $\alpha V_{k+1}$ obtained by multiplying the other threshold value $2V_{k+1}$ by a predetermined value α.

4. A transmission circuit according to claim 2, wherein when a predetermined number of sampling points of the amplitude signal exceeds the one threshold value $2V_k$ within the predetermined time period, the amplitude calculation section outputs a discrete value $\alpha V_{k+1}$ obtained by multiplying the other threshold value $2V_{k+1}$ by a predetermined value $\alpha$.

5. A transmission circuit according to claim 2, wherein the amplitude calculation section comprises:
   an amplitude limiting section for, when the amplitude signal has a level which is higher than the one threshold value $2V_k$, outputting an amplitude signal having a level limited to the one threshold value $2V_k$; and
   an amplitude processing section for, when the amplitude signal which is output from the amplitude limiting section has a level which is equal to the one threshold value $2V_k$, outputting a discrete value $\alpha V_{k+1}$ obtained by multiplying the other threshold value $2V_{k+1}$ by a predetermined value $\alpha$.

6. A transmission circuit according to claim 1, wherein calculation section comprises:
   an amplitude calculation section for comparing n number of threshold values $2V_n$ having levels continuously increasing discretely and the amplitude signal at an interval of the predetermine time period, and when the amplitude signal has a level which is higher than one of two continuous threshold values, $2V_k$, and is equal to, or lower than, the other threshold value $2V_{k+1}$, outputting a discrete value $V_{k+1}$ which is half of the other threshold value $2V_{k+1}$; and
   a LINC calculation section for calculating a phase component of the data of the predetermined form, calculating the predetermined phase by inverse-cosining a quotient obtained by dividing the level of the amplitude signal by the other threshold value $2V_{k+1}$, and outputting the first phase signal having the phase component shifted in one direction by the predetermined phase and the second phase signal having the phase component shifted in the other direction by the predetermined phase.

7. A transmission circuit according to claim 1, further comprising an amplitude amplification section to which the discrete value is input from the calculation section; wherein:
   the amplitude amplification section supplies a signal controlled in accordance with the level of the discrete value to the first amplitude modulation section and the second amplitude modulation section;
   the first amplitude modulation section performs amplitude modulation on the first angle-modulated signal with the signal which is output from the amplitude amplification section, and outputs the resultant signal as the first modulated signal; and
   the second amplitude modulation section performs amplitude modulation on the second angle-modulated signal with the signal which is output from the amplitude amplification section, and outputs the resultant signal as the second modulated signal.

8. A transmission circuit according to claim 7, wherein the amplitude amplification section is a switching regulator.

9. A transmission circuit according to claim 8, further comprising:
   a timing control section connected on a stage after the calculation section for controlling the timing for outputting the discrete value from the calculation section;
   a first variable gain amplification section connected on a stage after the first angular modulation section for amplifying the first angle-modulated signal with a gain in accordance with the level of the discrete value; and
   a second variable gain amplification section connected on a stage after the second angular modulation section for amplifying the second angle-modulated signal with a gain in accordance with the level of the discrete value;
   wherein the switching regulator supplies a voltage controlled in accordance with the level of the discrete value which is output from the timing control section to the first amplitude modulation section and the second amplitude modulation section.

10. A transmission circuit according to claim 7, wherein the amplitude amplification section is a series regulator.

11. A transmission circuit according to claim 7, wherein the amplitude amplification section includes a switching regulator and a series regulator connected to each other in series.

12. A transmission circuit according to claim 11, further comprising a timing control section connected on a stage after the calculation section for controlling the timing for outputting the discrete value from the calculation section to be advanced; wherein:
   the switching regulator supplies a voltage controlled in accordance with the level of the discrete value which is output from the timing control section to the series regulator; and
   the series regulator supplies a voltage controlled in accordance with the level of the discrete value which is output from the calculation section to the first amplitude modulation section and the second amplitude modulation section.

13. A transmission circuit according to claim 1, wherein the predetermined time period is longer than a symbol time of the transmission signal and is shorter than a unit time used for transmission power information indicating a level of an output power of the transmission signal.

14. A transmission circuit according to claim 1, wherein the calculation section,
   when an envelope of the transmission signal changes a little, changes the predetermined time period to be longer, and
   when the envelope of the transmission signal changes much, changes the predetermined time period to be shorter.

15. A transmission circuit according to claim 1, wherein:
   transmission power information indicating a level of an output power of the transmission signal is input to the signal generation section; and
   the signal generation section changes the level of the amplitude signal such that the amplitude signal has a positive characteristic with respect to the level of the output power indicated by the transmission power information.

16. A transmission circuit according to claim 1, further comprising a multiplication section to which transmission power information indicating a level of an output power of the transmission signal is input, the multiplication section being connected at a stage after the calculation section;
   wherein the multiplication section changes the level of the discrete value which is output from the calculation section such that the discrete value has a positive characteristic with respect to the level of the output power indicated by the transmission power information.

17. A transmission circuit according to claim 16, wherein:
   the amplitude amplification section includes a switching regulator and a series regulator connected to each other in series;
   the transmission power information is input to the switching regulator, and the switching regulator supplies a voltage controlled in accordance with the input transmission power information to the series regulator; and the series regulator supplies a voltage controlled in accordance with the level of the discrete value which is output from the calculation section to the first amplitude modulation section and the second amplitude modulation section.

18. A transmission circuit according to claim 16, further comprising a timing control section connected on a stage after the multiplication section for advancing the timing for outputting the discrete value from the multiplication section; wherein:

the amplitude amplification section includes a first switching regulator, a second switching regulator and a series regulator connected to each other in series;

the transmission power information is input to the first switching regulator, and the first switching regulator supplies a voltage controlled in accordance with the input transmission power information to the second switching regulator;

the second switching regulator supplies a voltage controlled in accordance with the level of the discrete value which is output from the timing control section to the series regulator; and the series regulator supplies a voltage controlled in accordance with the level of the discrete value which is output from the multiplication section to the first amplitude modulation section and the second amplitude modulation section.

19. A transmission circuit according to claim 1, further comprising a first variable gain amplification section and a second variable gain amplification section, to each of which a discrete value is input from the calculation section, wherein:

the first variable gain amplification section amplifies the first angle-modulated signal with a gain in accordance with the level of the discrete value, and outputs the amplified first angle-modulated signal to the first amplitude modulation section; and the second variable gain amplification section amplifies the second angle-modulated signal with a gain in accordance with the level of the discrete value, and outputs the amplified second angle-modulated signal to the second amplitude modulation section.

20. A transmission circuit according to claim 1, further comprising a predistortion section, provided at an output of the calculation section, for compensating at least one of the discrete value, the first phase signal and the second phase signal so as to suppress a distortion caused in at least one of the first angular modulation section, the second angular modulation section, the first amplitude modulation section, the second amplitude modulation section, and the amplitude amplification section.

21. A communication apparatus, comprising:

a transmission circuit for generating a transmission signal; and an antenna for outputting the transmission signal generated by the transmission circuit;

wherein the transmission circuit is a transmission circuit according to claim 1.

22. A communication apparatus according to claim 21, further comprising:

a receiving circuit for processing a receiving signal received from the antenna; and an antenna duplexer for outputting the transmission signal generated by the transmission circuit to the antenna, and outputting the receiving signal received from the antenna to the receiving circuit.

* * * * *